(12) United States Patent
Nemoto et al.

(10) Patent No.: US 6,685,052 B1
(45) Date of Patent: Feb. 3, 2004

(54) FEEDING APPARATUS FOR CHIP COMPONENT

(75) Inventors: Akira Nemoto, Shiga-ken (JP); Shigeki Takahashi, Shiga-ken (JP); Nihei Kaishita, Shiga-ken (JP); Mitsuhiro Namura, Shiga-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 257 days.

(21) Appl. No.: 09/684,676

(22) Filed: Oct. 11, 2000

(30) Foreign Application Priority Data

Nov. 2, 1999 (JP) .............................. 11-311835
Aug. 17, 2000 (JP) ....................... 2000-247227

(51) Int. Cl.[7] .............................. B23Q 7/12; B65H 9/00
(52) U.S. Cl. ..................... 221/157; 221/163; 221/168; 221/172; 221/236; 221/239; 221/258
(58) Field of Search ................................. 221/156, 157, 221/163, 167, 168, 171, 172, 236, 239, 245, 258

(56) References Cited

U.S. PATENT DOCUMENTS 6,112,937 A * 9/2000 Takahashi et al. .......... 221/167
6,161,676 A * 12/2000 Takahashi et al. ...... 221/168 X
6,209,713 B1   4/2001 Takahashi et al.
6,264,061 B1 * 7/2001 Fukai et al. ................ 221/171
6,443,326 B1 * 9/2002 Saito et al. ................. 221/163

FOREIGN PATENT DOCUMENTS

| EP | 0 885 820 | 12/1998 |
|----|-----------|---------|
| GB | 2 327 080 | 1/1999 |
| JP | 5-306013 | 11/1993 |
| JP | 8-143164 | 6/1996 |
| JP | 11-71018 | 3/1999 |
| JP | 11-71019 | 3/1999 |
| JP | 2000-16557 | 1/2000 |
| JP | 2000-85946 | 3/2000 |

* cited by examiner

Primary Examiner—David H. Bollinger
(74) Attorney, Agent, or Firm—Burns, Doane, Swecker & Mathis, LLP

(57) ABSTRACT

A feed lever is lowered, correspondingly to the load input of a chip mounter. A rotary drum is intermittently moved through a conversion mechanism, intermittently in one direction. Chip components placed in a component accommodation chamber are aligned and discharged. When a rotation resistance larger than a predetermined value acts, a belt is slid, and breaking of a chip component is prevented.

19 Claims, 18 Drawing Sheets

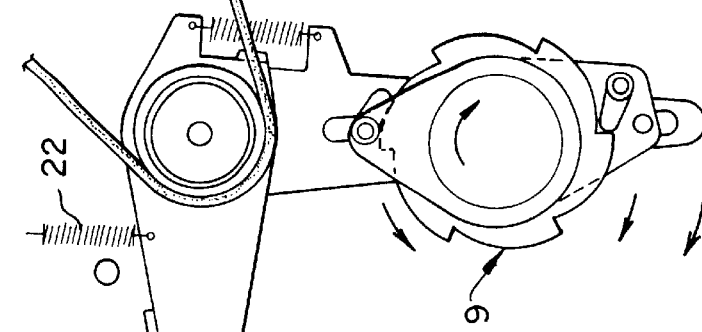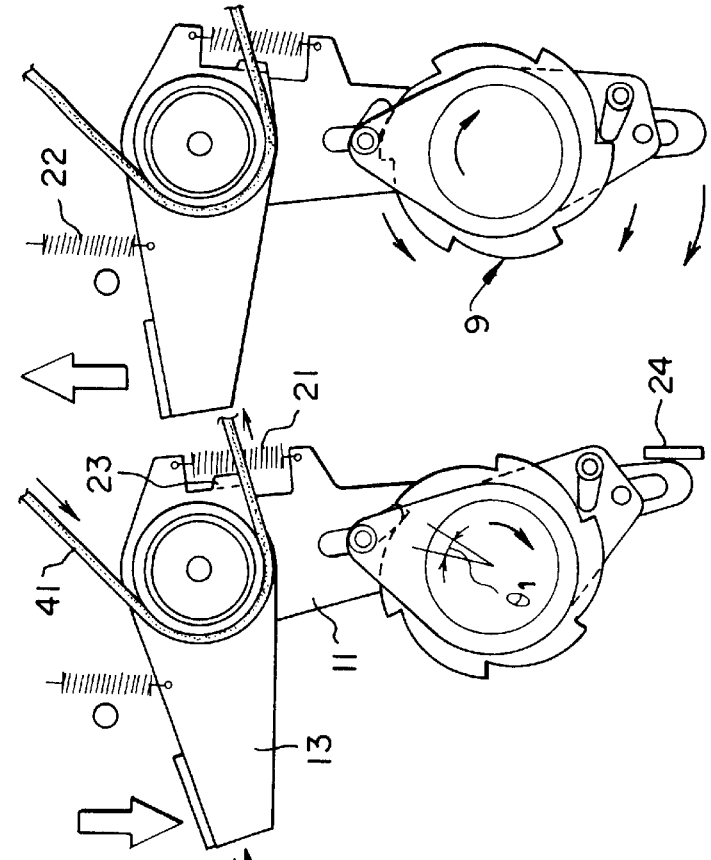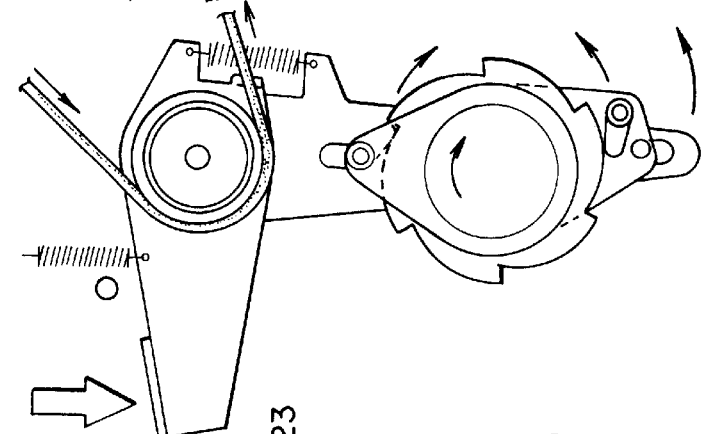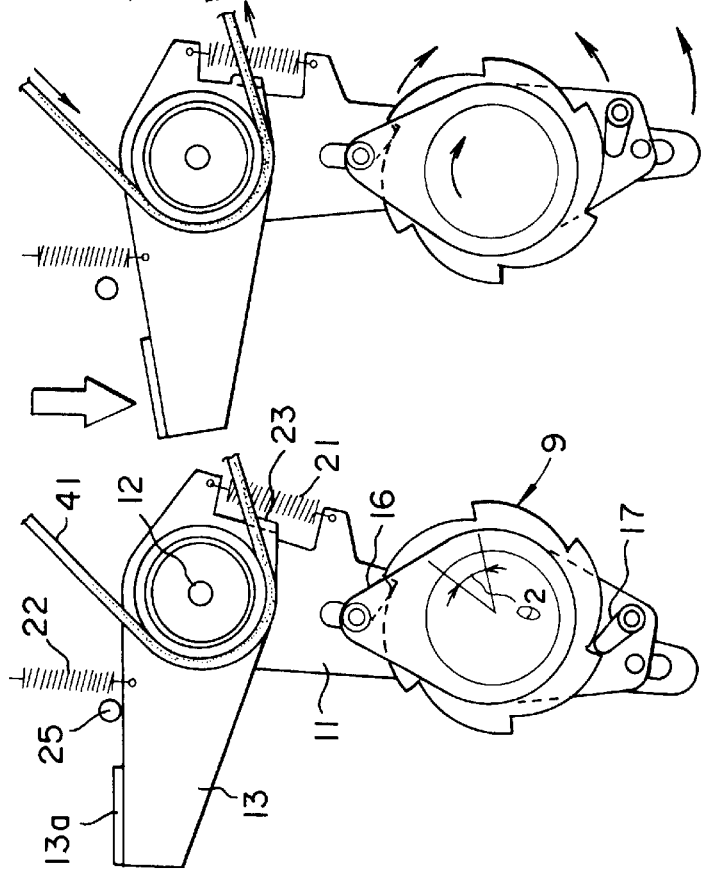

DISCHARGING
DIRECTION

DISCHARGING
DIRECTION

FEEDING APPARATUS FOR CHIP COMPONENT

BACKGROUND OF THE INVENTION

1. Field of the Invention

The present invention relates to a feeding apparatus for chip components, and more particularly to a feeding apparatus for aligning chip components in one row and feeding the components by utilizing a load input from a chip mounter.

2. Description of the Related Art

Conventionally, there is proposed a feeding apparatus for chip components which comprises a component accommodation chamber formed between a stationary drum and a rotary drum and suited to accommodate the chip components, a chute groove formed in the inner periphery of the component accommodation chamber, a gate port formed in the lower end of the chute groove, allowing chip components sliding down along the chute groove in a predetermined posture to pass therethrough one by one, a discharging path for aligning the chip components in one row and discharging the components, and a claw formed on the inner wall of the rotary drum, suited to energize a chip component stopping in the gate port in an abnormal posture oppositely to the discharging direction to release the clogging of the chip component (Japanese Unexamined Patent Application Publication No. 11-71019). The rotary drum is rotation-driven continuously in one direction by means of an electric motor.

The chip components aligned in one row and discharged from the discharging path is conveyed to a take-out position by means of a conveying means disposed in the end of the discharging path. There, the chip components are adsorbed one by one by a chip mounter to be taken out, and is mounted onto a printed substrate or the like. Thus, by rotating the rotary drum by utilizing a driving force for the chip mounter, a driving source for rotating the rotary drum becomes unnecessary. Advantageously, the structure can be simplified, and moreover, the rotation of the rotary drum and the absorption and taking-out of the chip components can be synchronously carried out.

In recent years, a high feeding capability is demanded for feeding apparatuses for components. The feeding time per one chip component of up to 0.1 second has been gradually realized. When a chip component is fed in such a short time, it is necessary to rotate the rotary drum at a high speed. The chip component, if it is clipped between the claw of the rotary drum and the gate port, may be broken.

SUMMARY OF THE INVENTION

Accordingly, it is an object of the present invention to provide a feeding apparatus in which for driving of a rotary member, an especial driving source is unnecessary, and breaking of a chip component can be prevented by escaping an excessive force applied when the chip component is caught in the rotary member.

To achieve the above object, according to the present invention, there is provided a feeding apparatus for a chip component having a component accommodation chamber for accommodating many chip components, an alignment path for aligning the chip components in the component accommodation chamber on one row to discharge, and a rotary member for solving clogging of a chip component in the alignment path, which comprises a feed lever operable to be reciprocated linearly or swiveled correspondingly to a load input from a chip mounter, and a conversion mechanism for converting the motion of the feed lever to the rotational movement of the rotary member and having a torque limit function of escaping the rotational force of the rotary member when the rotational resistance of the rotary member becomes higher than a predetermined value.

In this feeding apparatus, with a load input of the chip mounter, the feed lever is reciprocated linearly or swiveled. This movement is converted to the rotational movement of the rotary member through the conversion mechanism. The rotary member release clogging of a chip component in the alignment path. At this time, the chip component may be clipped between the rotary member and the component accommodation chamber, so that a large resistance to the rotation would be generated. In this case, with the torque limit function of the conversion mechanism, the rotational force of the rotary member is escaped to prevent an excessive load from being applied to the chip component. Thus, breaking of the chip component can be prevented.

Preferably, the alignment path comprises a chute groove formed in the inner periphery of the component accommodation chamber and suited to align chip components in a predetermined direction and slide the chip components downward, a gate port formed in the lower end of the chute groove and permitting chip components sliding down in a predetermined posture along the chute groove to pass therethrough, and a discharging path for aligning the chip components passed through the gate port in one row to discharge.

In this case, with the chute groove, the chip components are arranged in direction, and moreover, the postures are arranged by making the chip components pass the gate port. Thus, with the two steps of arrangement, the chip components are arranged at any time to have constant direction and postures.

Preferably, the rotary member is a claw portion provided on the inner wall of a rotary drum constituting one side wall of the component accommodation chamber, operable to be rotated along the inner periphery of the component accommodation chamber, and sited to energize a chip component stopping in the gate port in an abnormal posture oppositely to the discharging direction to release the clogging.

In this case, a part of the component accommodation chamber functions as the rotary member. Thus, the number of parts can be reduced, and the structure can be simplified.

As the conversion mechanism, different types are suggestable. For example, preferably, the conversion mechanism comprises a shaft for swivelably supporting the feed lever, a driving pulley attached to the shaft, a driven pulley attached to the rotary member, a one-way clutch provided between the shaft for the feed lever and the driving pulley or between the rotary member and the driven pulley, and a belt provided between and wound around the driving pulley and the driven pulley, whereby the belt is slid when a torque higher than a predetermined value is applied to the driving pulley or the driven pulley. Thus, the torque limit functions can be performed.

Also preferably, the conversion mechanism comprises a power transmission means provided between the feed lever and the rotary member and utilizing an eddy current damper, and a one-way clutch allowing the rotary member to rotate only in one direction. In this case, the eddy current damper causes the torque limit function. The eddy current damper may comprise a non-magnetic conductor provided on one of the member, a yoke provided on the other of the member, constituting a magnetic path, and a magnet attached to the yoke in such a manner that a flux acts on the non-magnetic conductor orthogonally. When relative movement is caused between the conductor and the yoke, an eddy current is induced in the conductor in the direction in which the magnetic flux of the eddy current is prevented from changing. The eddy current causes a resisting force between the yoke and the conductor. With the resisting force, the rotary member can be rotated following the feed lever. If a chip component is clipped between the rotary member and a member near to the rotary member while chip components are aligned, the eddy current damper escapes an excessive force applied to the rotary member, so that breaking of the chip component can be prevented. The eddy current damper has no sliding parts, and therefore, the torque limit function is not changed, e.g., by abrasion. The torque limit function can be kept for a long time period.

Moreover, the conversion mechanism may comprise a swiveling member interlocked with the feed lever and provided coaxially with the rotary member, a power transmission means provided between the swiveling member and the rotary member and utilizing an eddy current damper, and a one-way clutch allowing the rotary member to rotate only in one direction. When the power transmission mechanism utilizing the eddy current damper is provided between the feed lever and the rotary member, as described above, a loss in the driving force is large, since the former is moved linearly, and the latter is rotated. On the other hand, in the case in which the eddy current damper is provided between the swiveling member and the rotary member which are coaxially rotated, a loss in the driving force generated by the eddy current damper can be reduced, even when the feed lever is linearly moved.

Preferably, the conversion mechanism comprises a first swiveling member interconnected with the feed lever and operable to be swiveled by operation of the feed lever, a second swiveling member provided coaxially with the first swiveling member and operable to be swiveled correspondingly to the movement of the first swiveling member, a power transmission means provided between the first and second swiveling members and utilizing an eddy current damper, and a one-way clutch allowing the rotary member to rotate only in one direction. Also in this case, even when the feed lever is linearly moved, the eddy current damper effect can be effectively achieved, since the first swiveling member and the second swiveling member are coaxially swiveled. Moreover, the first and second swiveling members, and the eddy current damper mechanism can be provided at different positions from those of the feed lever and the rotary member, the flexibility of the layout is enhanced, and the height of the feeding apparatus can be decreased. When the swiveling member and the rotary member are coaxially rotated, as described above, the swiveling member is increased in size, and the motion of the feed lever is slow, affected by the inertia. On the other hand, in this conversion mechanism, the first and second swiveling members can be formed so as to have a small size, and therefore, effects of inertial can be reduced.

BRIEF DESCRIPION OF THE DRAWING

FIG. 5 illustrates the operation of a driving mechanism shown in FIG. 1;

Figure 12:
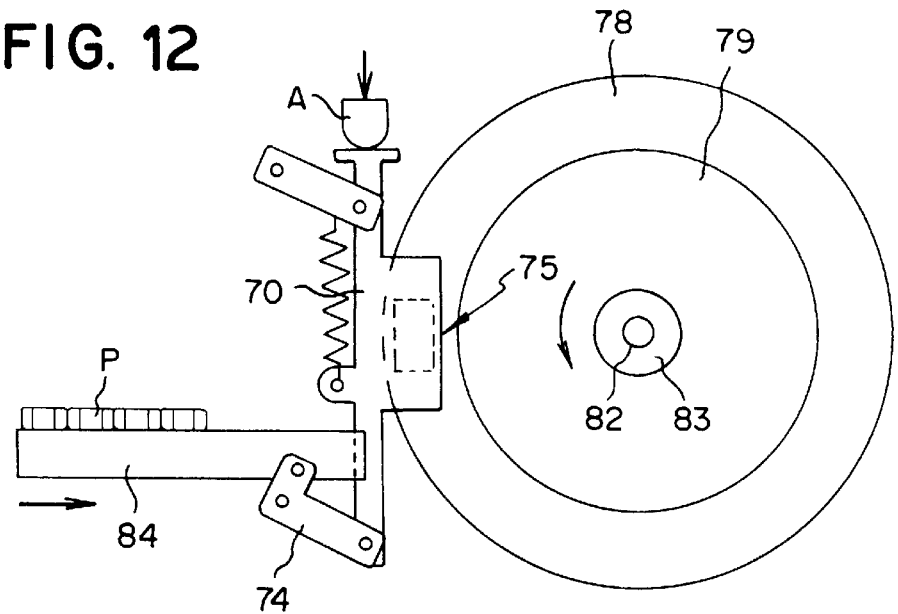
Figure 13:
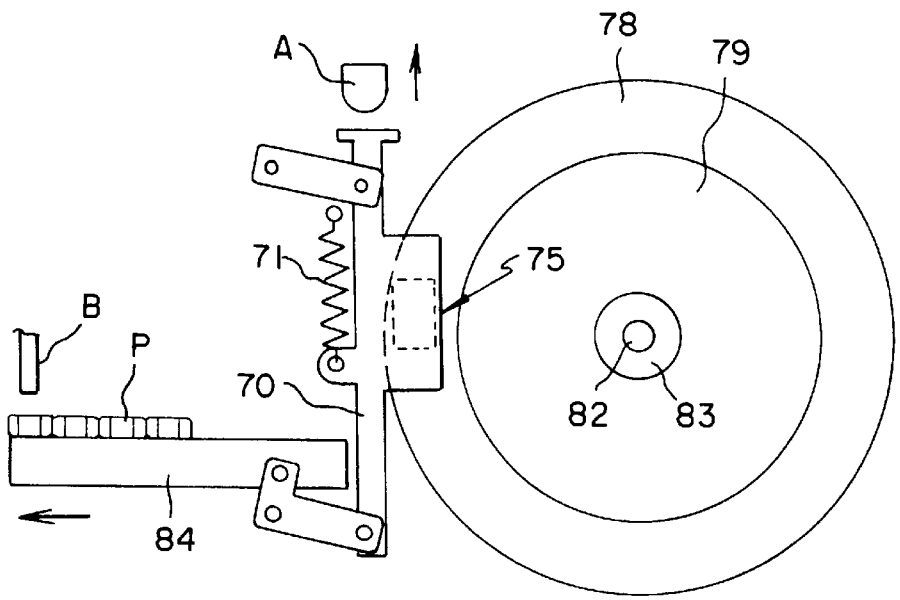
Figure 14:
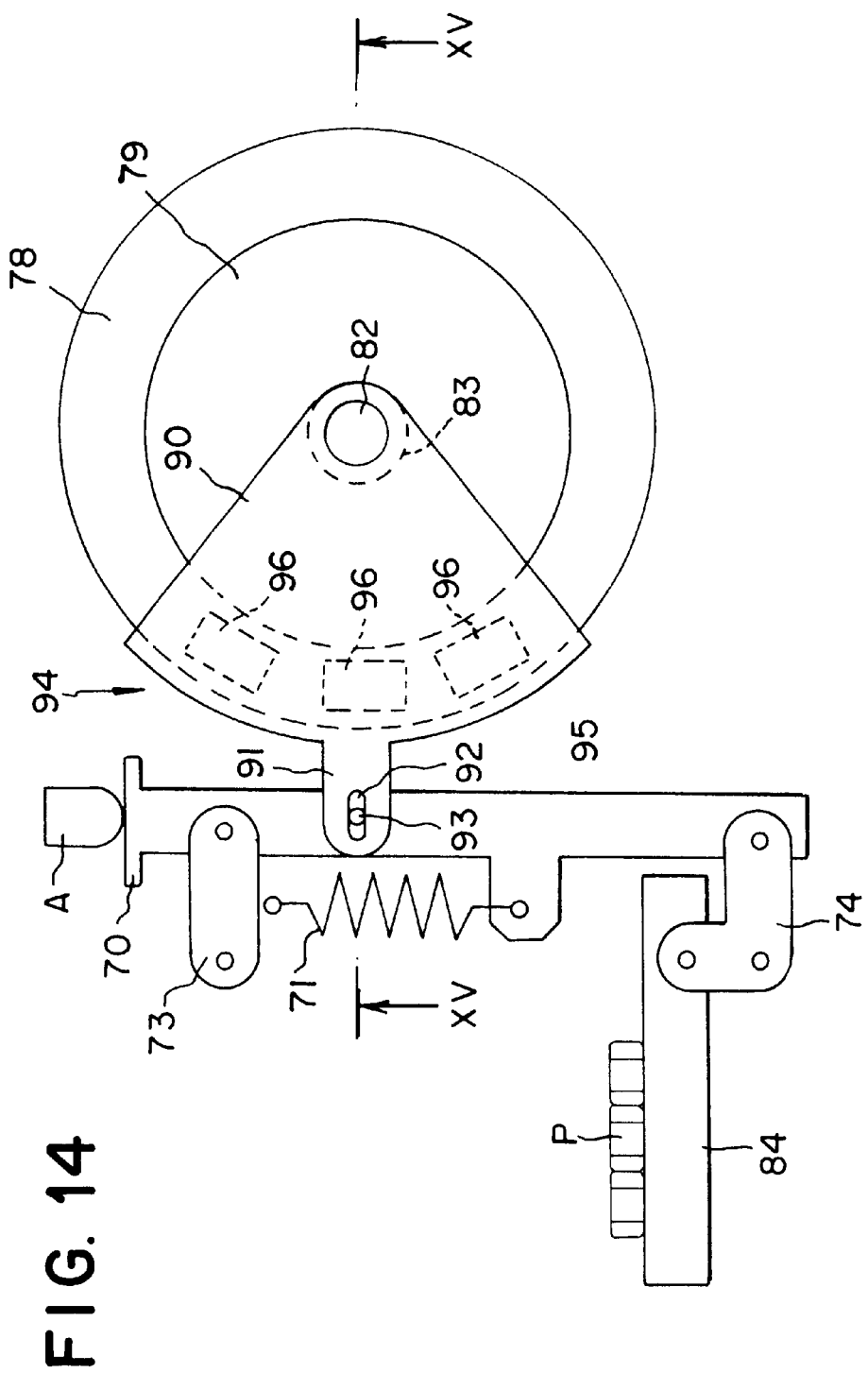
Figure 15:
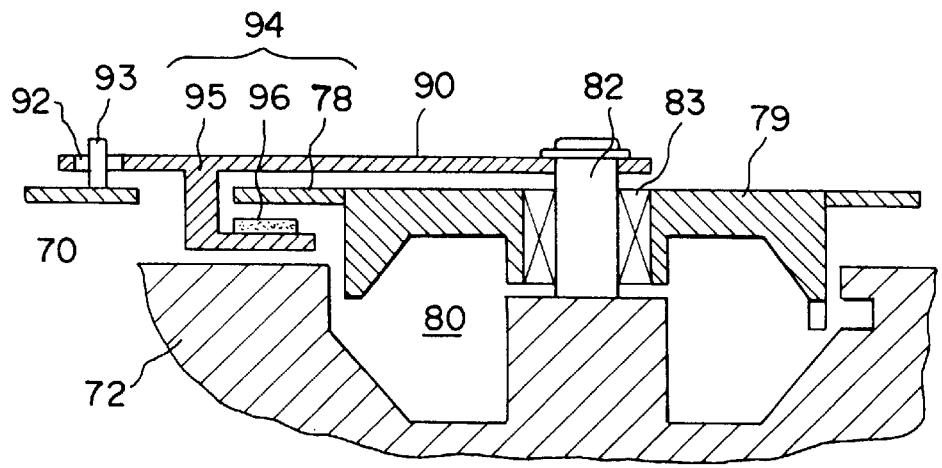
Figure 16:
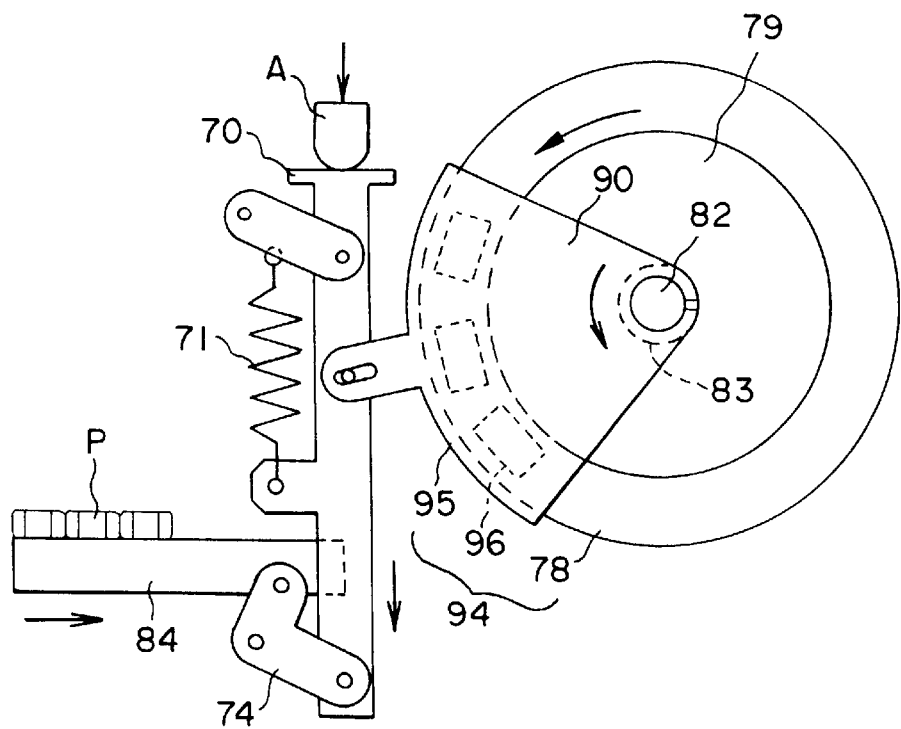
Figure 17:
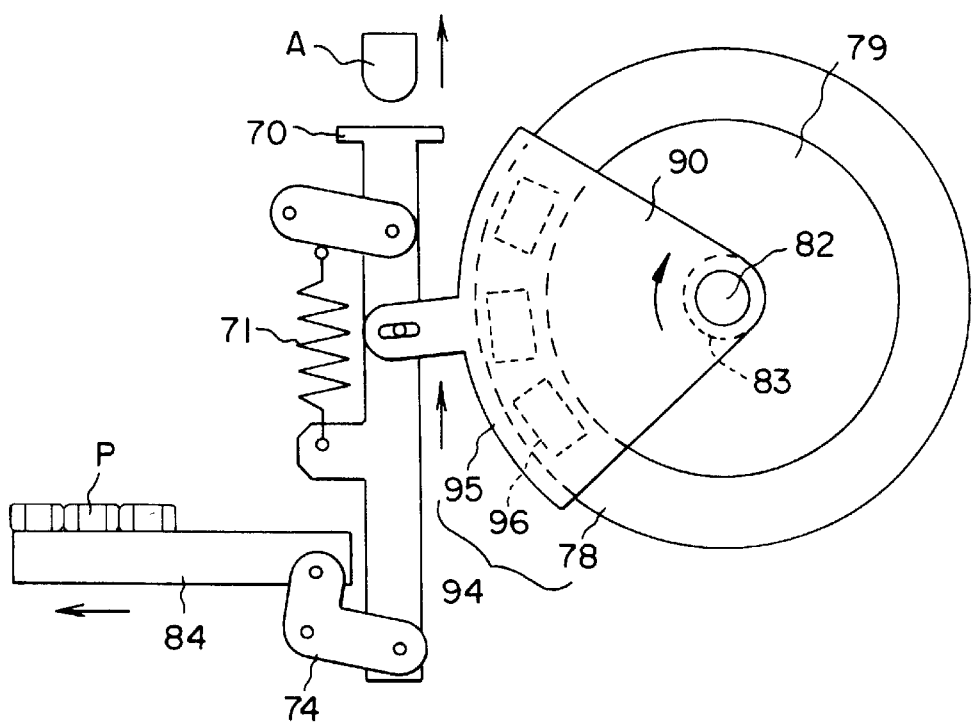
Figure 18:
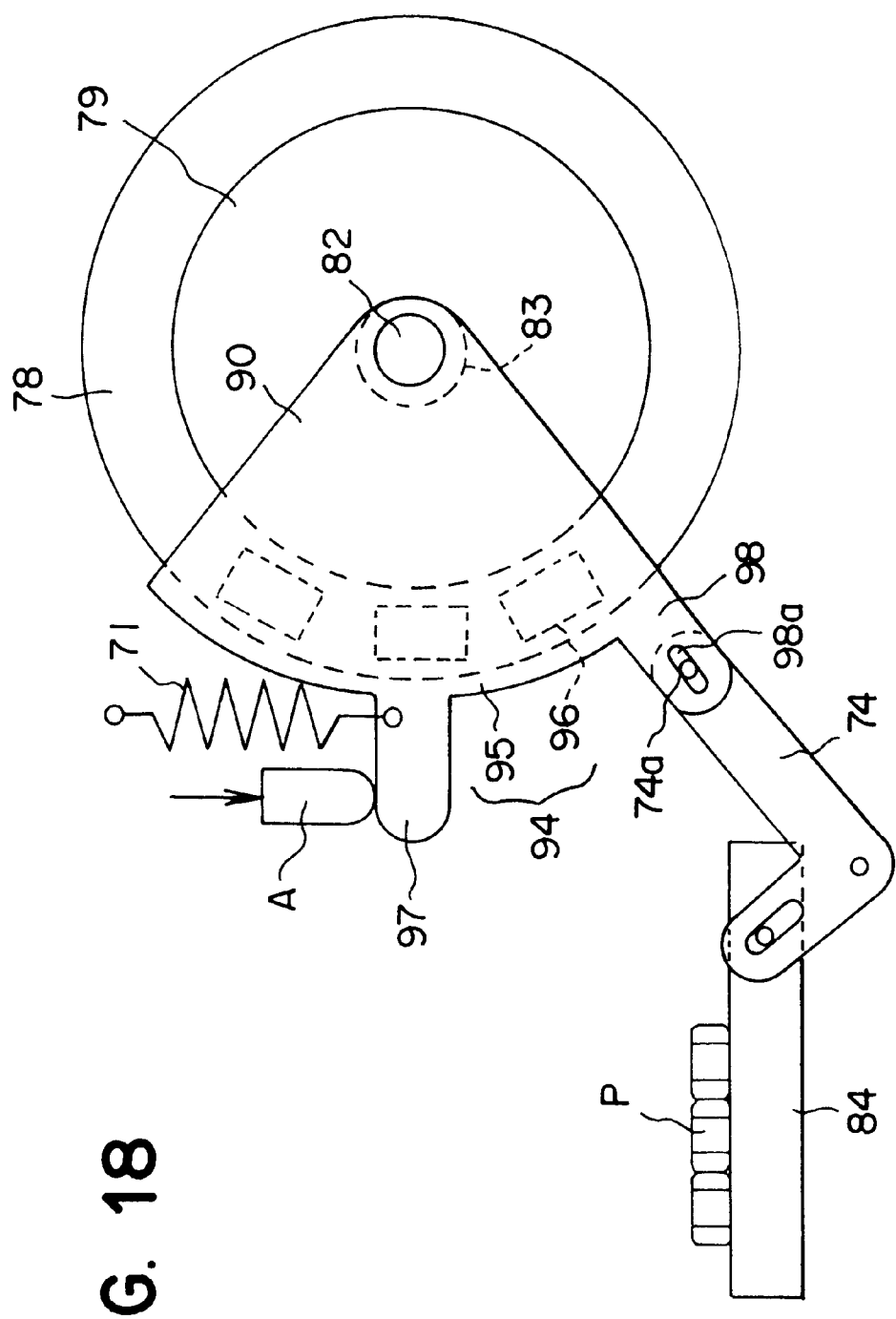
Figure 19:
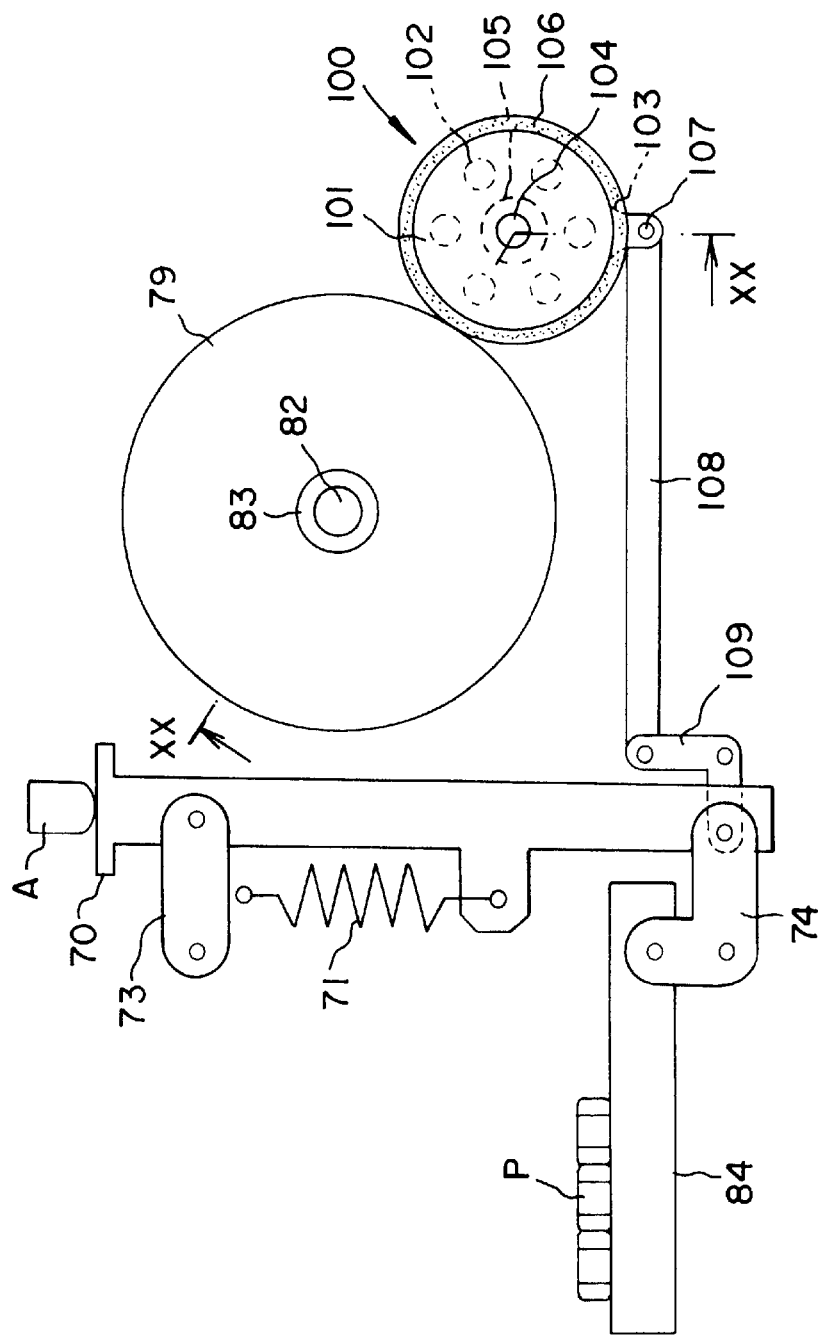
Figure 20:
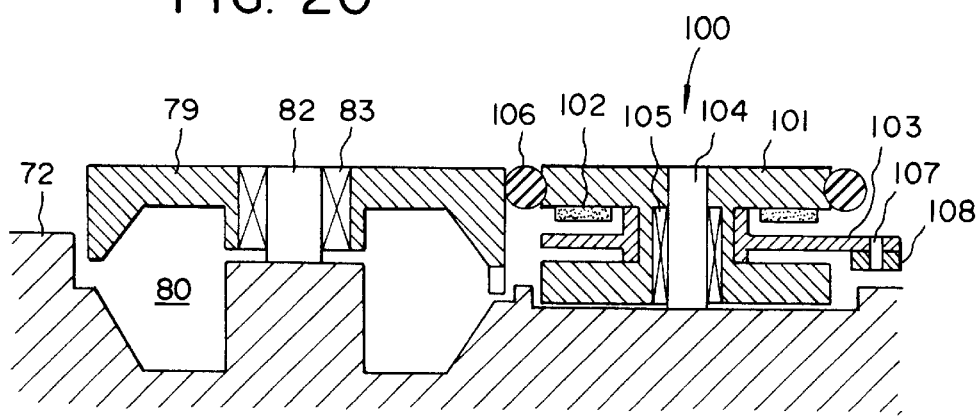
Figure 21:
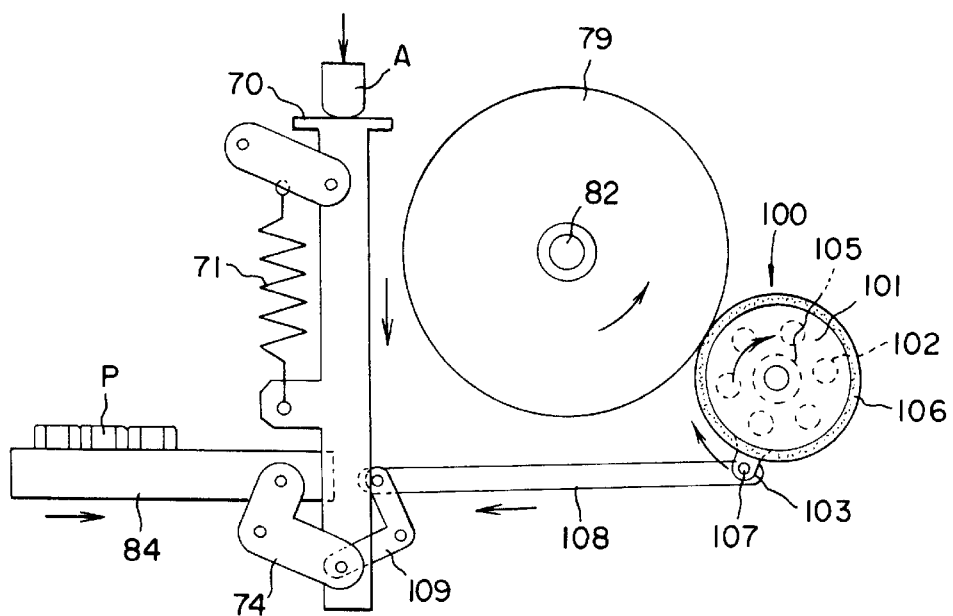
Figure 22:
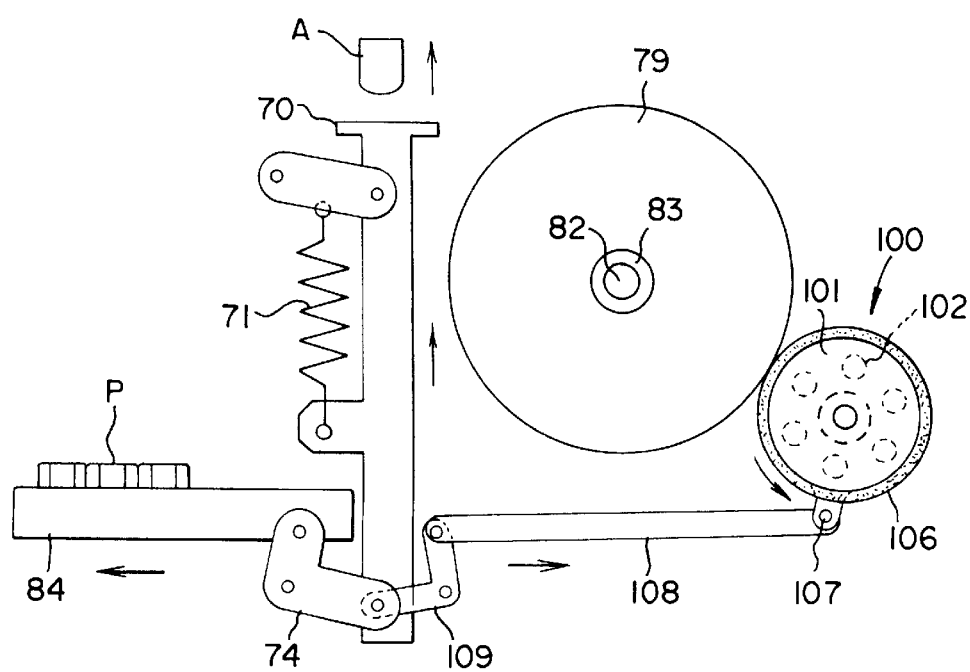
Figure 23:
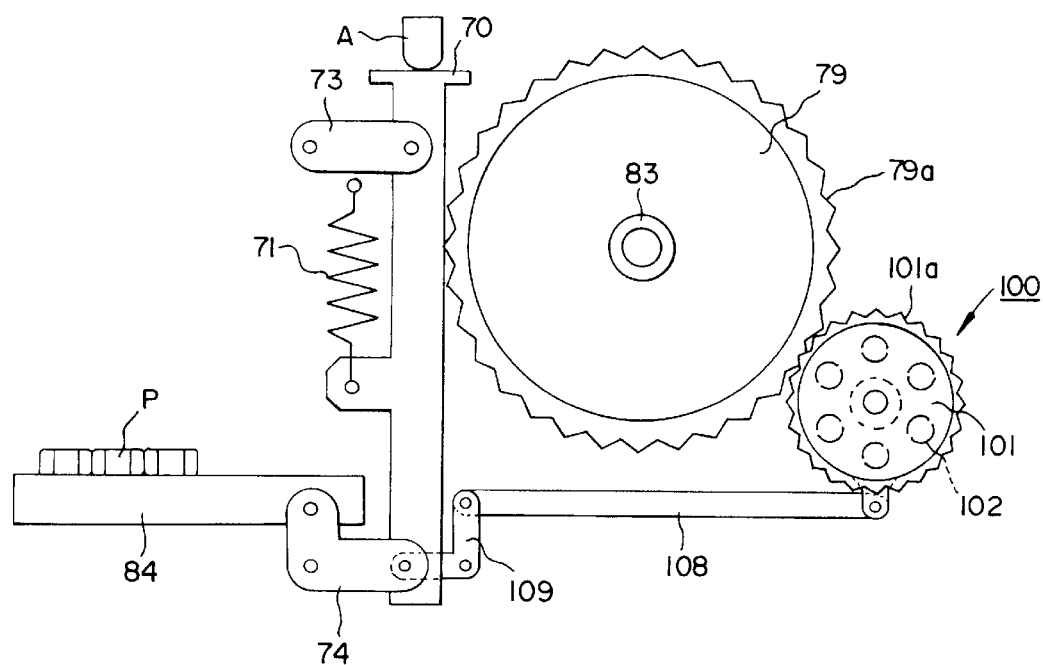

FIG. 12; is a front view of the feeding apparatus postured when it is lowered;

FIG. 13 is a front view of the feeding apparatus postured when it is elevated;

FIG. 14 is a front view of a feeding apparatus according to a fourth embodiment of the present invention;

FIG. 15 is a cross sectional view taken along line XV—XV in FIG. 14;

FIG. 16 is a front view of the feeding apparatus of FIG. 14 postured when it is lowered;

FIG. 17 is a front view of the feeding apparatus of FIG. 14 postured when it is elevated;

FIG. 18 is a front view of a feeding apparatus according to a fifth embodiment of the present invention;

FIG. 19 is a front view of a feeding apparatus according to a sixth embodiment of the present invention;

FIG. 20 is a cross sectional view taken along line XX—XX in FIG. 19;

FIG. 21 is a front view of the feeding apparatus of FIG. 19, postured hen it is lowered;

FIG. 22 is a front view of the feeding apparatus of FIG. 19, postured wen it is elevated; and FIG. 23 is a front view of a feeding apparatus according to a seventh embodiment of the present invention.

DESDCRIPTION OF THE PREFERRED EMBODIMENTS

FIGS. 1 to 6 show a first embodiment of a feeding apparatus for a chip component according to the present invention. In this embodiment, an angular chip electronic component having electrodes at both end-portions is employed as a chip component P (see FIG. 7A).

Figure 3:
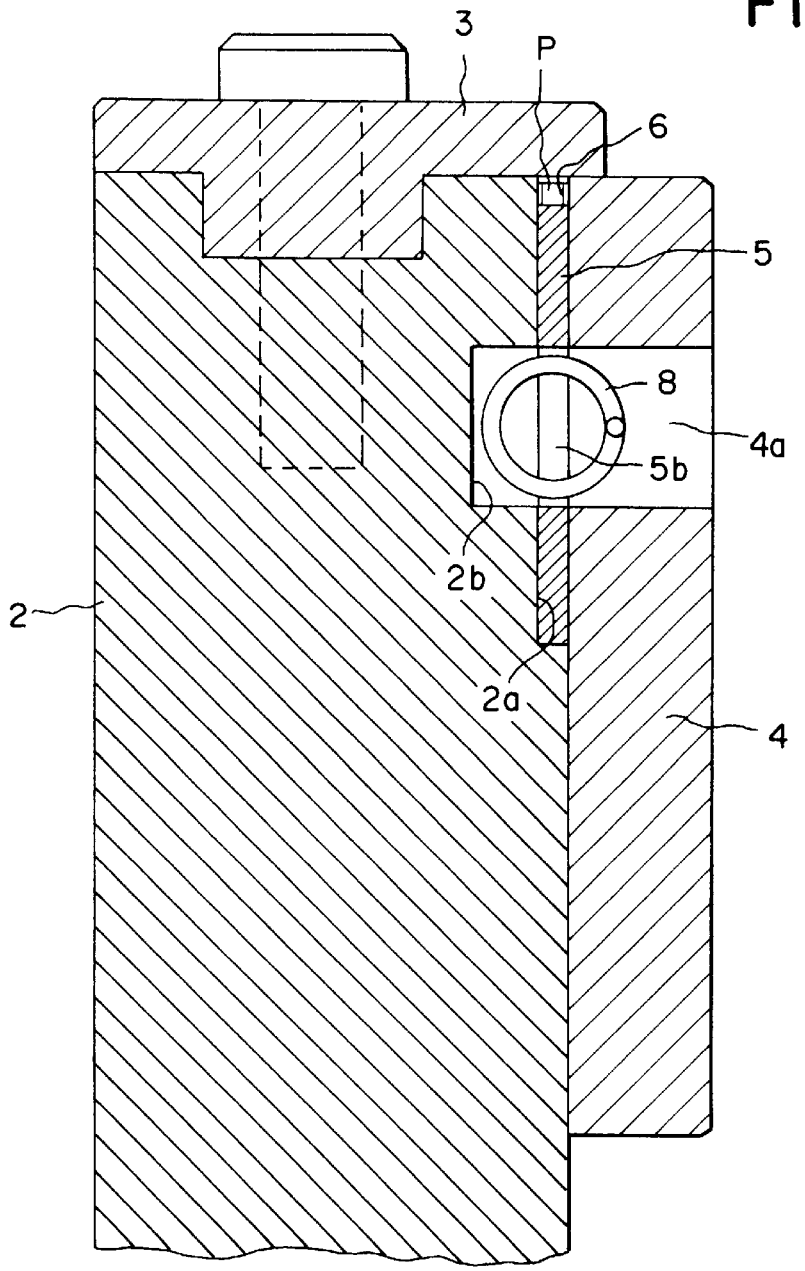
FIG. 3 is a cross sectional view taken along line III—III in FIG. 1.

On the front-face of a vertical wall portion 2 of a conveyor body 1, a concave step 2a is formed, as shown in FIG. 3. A narrow space is defined by a front-side cover 4 fixed to the front side of the vertical wall portion 2. In the space, a blade 5 as an example of a conveying member is disposed slidably in the horizontal direction. An upper-side cover 3 is fixed to the upper-side of the vertical wall portion 2 to prevent a components P from springing out while it is conveyed. A guide groove 6 for aligning components P in one row and guiding the components P is defined by the inner face of the above-mentioned concave step 2a, the inner-face of the front-side cover 4, and the upper face of the blade 5, and the under-face of the upper-side cover 3.

The blade 5 is formed from a thin metallic sheet, and has a long hole 5a elongating in the horizontal direction and a spring accommodation hole 5b formed therein. Into the above-mentioned long hole 5a, a pin 7 formed on the vertical wall portion 2 and projecting therefrom is inserted and guides the blade in the horizontal direction. A spring 8 is accommodated in the spring accommodation hole 5b. Both of the side portions in the radial direction of the spring 8 are accommodated in a groove 2b formed in the vertical wall portion 2 and an open hole 4a formed in the front-side cover 4 (see FIG. 3). The rear of the spring 8 is supported by the spring accommodation hole 5b, and the front thereof is supported by the front-end faces of the groove 2b and the open hole 4a. The spring 8 energizes the blade 5 in the backward direction at all times.

Figure 2:
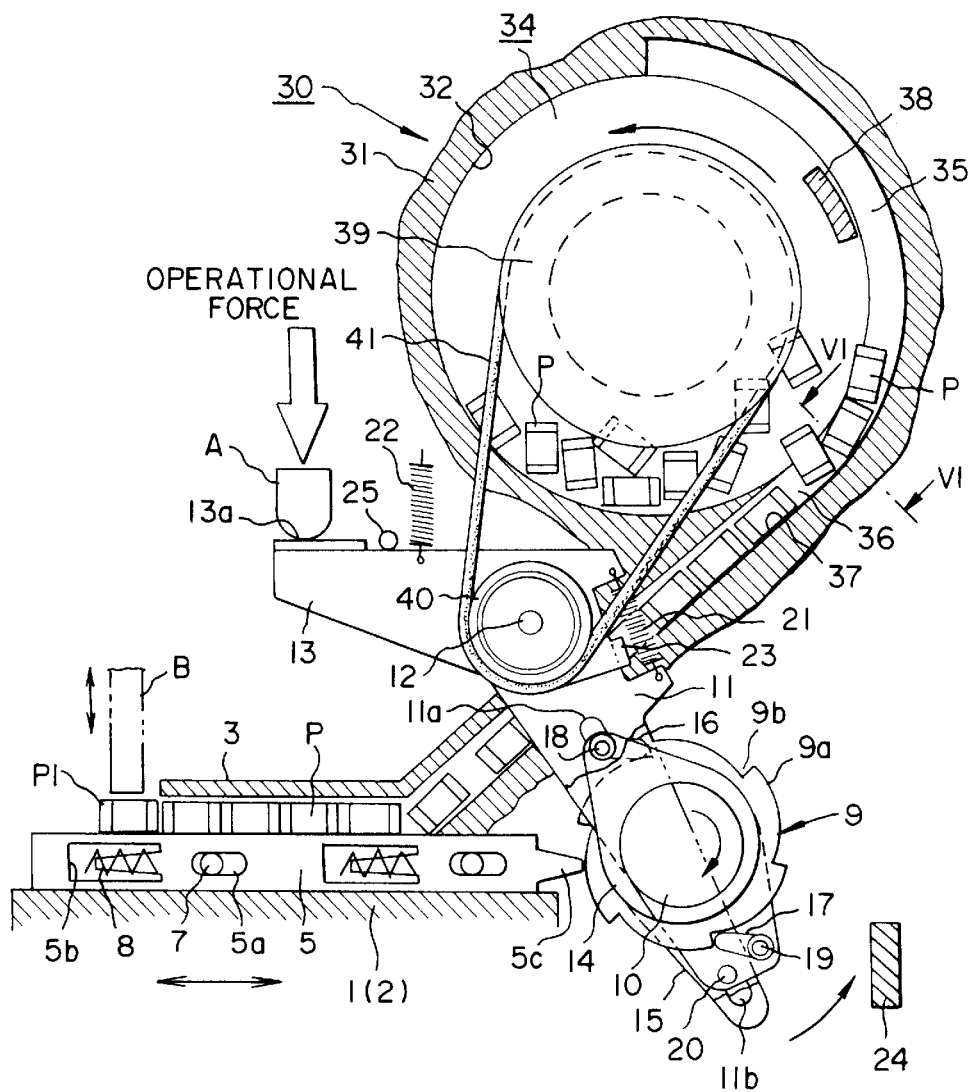
FIG. 2 illustrates the inner structure of the feeding apparatus of FIG. 1.

The rear end 5c of the spring 8 contacts with the peripheral face of a conveying cam (ratchet gear) 9 mounted to the body 1 rotatably on a rotation shaft 10. The above-mentioned spring 8 and the cam 9 constitute a driving means for reciprocating the blade 5. The cam 9 has tops 9a and bottoms 9b, as shown in FIG. 2, and is intermittently rotated in the direction indicated by the arrow according to a ratchet mechanism which will be described later. Accordingly, while the rear end of the blade 5 is being raised along a top 9a, the blade 5 moves forward at a low velocity. When the rear end 5c falls into a bottom 9b, the blade 5 moves backward at a high speed. The advancement speed of the blade 5 is set at such a value that a predetermined frictional-holding force acts on the blade 5 and components P placed on the upper-side of the blade 5. The recession speed of the blade 5 is set at such a value that the frictional force between the blade 5 and the components P placed on the upper side thereof becomes ineffective. The top component P1 of the components P conveyed forward by the blade 5 is exposed from the upper-side cover 3, and is adsorbed onto the adsorption nozzle B of a chip mounter.

Figure 4:
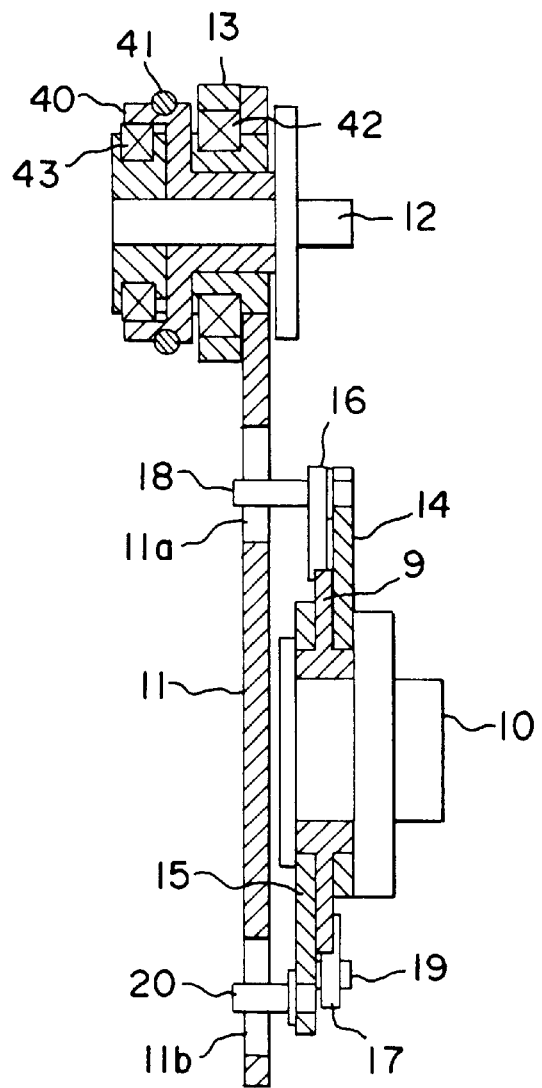
FIG. 4 is a cross sectional view taken along line IV—IV in FIG. 1.
Figure 6:
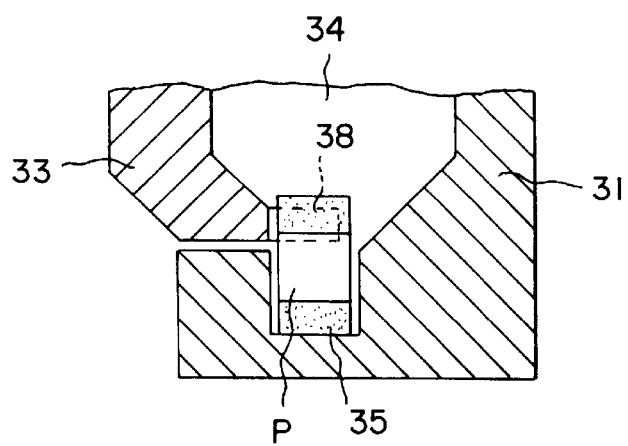
FIG. 6 is a cross sectional view taken along line VI—VI in FIG. 2.

A ratchet mechanism for intermittently rotating the above-described cam (ratchet gear) 9 is provided on the vertical wall portion 2 of the body 1. The ratchet mechanism comprises a link 11 having the upper end supported on a swiveling shaft 12 as a support which is in parallel to the rotation shaft 10 of the ratchet gear 9, a feed lever 13 provided swivelably on the above-mentioned swiveling shaft 9 as a support, and first and second attachment plates 14 and 15 provided rotatably, coaxially with the ratchet gear 9, respectively, as shown in FIG. 4. First and second ratchet claws 16 and 17 are attached to the first and second attachment plates 14 and 15, rotatably on interlocking shafts 18 and 19 as supports and energized in the direction in which the claws 16 and 17 are engaged with the ratchet gear 9 (in FIG. 2, in the clockwise direction). The first ratchet claw 16 is engaged with the ratchet gear 9 at a position relatively near to the swiveling shaft 12, while the second ratchet claw 17 is engaged with the ratchet gear 9 at a position relatively far from the swiveling shaft 12. Long holes 11a and 11b elongating in the longitudinal direction are formed in the middle and lower-end portions of the link 11, respectively. The interlocking shaft 18 of the first ratchet claw 16 is engaged with the long hole 11a formed in the middle portion of the link 11, while a pin 20 provided on the second attachment plate 15 is engaged with the long hole 11b provided in the lower-end portion of the link 11. Accordingly, simultaneously with swiveling of the link 11, the ratchet claws 16 and 17 are reciprocated in the front and rear direction (in the right and left direction in FIG. 2).

A downward operational force from the mounter lever A of the chip mounter is intermittently applied to the free end 13a of the above-mentioned feed lever 13 at predetermined timing. A first spring comprising a tension spring is provided between the feed lever 13 and the link 11. A first stopper 23 is formed on the feed lever 13 so as to contact with the rear end face of the link 11. Due to the fact that the stopper 23 contacts with the rear end-face of the link 11, the rotation angle between the feed lever 13 and the link 11 is regulated so that the first spring 21 is kept in the state where a predetermined tension force is applied to the first spring 21. The feed lever 13 is energized with a second spring 22 oppositely to the operational force direction. The initial position of the feed lever 13 is defined by a third stopper 25. Moreover, a second stopper 24 for regulating swiveling of the link 11 in the forward direction (in FIG. 2, in the anti-clockwise direction). The stop position of the second stopper 24 can be adjusted.

Next, operation of the ratchet mechanism will be described with reference to FIGS. 5A, 5B, 5C, and 5D.

In the initial state, as shown in FIG. 5A, the feed lever 13 is raised by the spring 22, and contacts with the stopper 25. The link 11 is clockwise swiveled by the stopper 23. Moreover, the two ratchet claws 16 and 17 are in 180° symmetric positions of the ratchet gear 9, and are engaged with the ratchet gear 9, respectively.

Next, the free end 13a of the feed lever 13 is forced to be lowered by means of a mounter lever A, so that the feed lever 13 starts to be anti-clockwise swiveled as shown in FIG. 5B. Synchronously, the link 11 is anti-clockwise swiveled (moving forward), due to the action of the spring 21 and the stopper 23. The interlocking shafts 18 and 20 engaged with the long-holes 11a and 11b are clockwise moved. Thus, the plate 14 is clockwise rotated, while the plate 15 is anti-clockwise rotated, respectively. Accordingly, the ratchet claw 16 disposed on the plate 14 and positioned on the upper side is engaged with the ratchet gear 9, causing the ratchet gear 9 to rotate clockwise. Simultaneously, the ratchet claw 17 disposed on the plate 15 and positioned on the lower side is slid on the peripheral face of the ratchet gear 9 in the anti-clockwise direction, which permits the ratchet gear 9 to rotate.

In FIG. 5C, the feed lever 13 is pushed downward to the lower limit position. In the state, the tip of the link 11 contacts with the stopper 24 to be stopped, and the ratchet gear 9 stops rotating. Then, the ratchet claw 17 on the lower side is engaged with the next bottom 9b of the ratchet gear 9. Even if the swiveling angle of the feed lever 13 is larger than that of the link 11, only the feed lever 13 is swiveled after the link 11 contacts with the stopper 24 to be stopped, since the spring 21 is provided between the feed lever 13 and the link 11. Thus, the stop position of the link 11 can be correctly regulated.

Next, when the downward pushing force of the mounter lever A is released, the feed lever 13 is clockwise swiveled, caused by the spring 22, as shown in FIG. 5D. The contact of the stopper 23 with the rear end of the link 11 causes the link 11 to swivel clockwise (moving backward), following the feed lever 13. At this time, the ratchet claw 17 on the lower side, engaged with the ratchet gear 9, causes the ratchet gear 9 to rotate clockwise, and simultaneously, the ratchet claw 16 on the upper side is anti-clockwise slid on the peripheral face of the ratchet gear 9, which permits the rotation of the ratchet gear 9. When the feed lever 13 gets into contact with the stopper 25 to stop, the link 11 also stops swiveling. That is, as shown in FIG. 5A, the two ratchet claws 16 and 17 are engaged with the ratchet gear 9 in 180° symmetric positions of the ratchet gear 9.

In this embodiment, when the feed lever 13 is lowered and raised, in other words, when the link 11 is swiveled anticlockwise (moving forward) and also, clockwise (moving backward), the ratchet gear 9 can be rotated at a high speed, since the ratchet gear 9 is forced to rotate. In addition, at least one of the ratchet claws 16 and 17 is engaged with the ratchet gear 9 at all times. Accordingly, the ratchet gear 9 can be securely prevented from rotating reversely, though no especial claw is additionally provided.

The angle $\theta_1$ at which the first ratchet claw 16 positioned near to the swiveling shaft 12 rotates the ratchet gear 9 is smaller than the angle $\theta_2$ at which the second ratchet claw 17 positioned far form the swiveling shaft 12 rotates the ratchet gear 9. That is, the rotation angle of the ratchet gear (cam) 9 when the blade 5 falls into a bottom 9b of the cam is small, while that when the blade 5 is raised on a top 9a of the cam 9 is large. Accordingly, the rear end 5c of the blade 5 can be continuously raised onto the top 9a of the cam 9 without stopping temporarily on the way to the top 9a. Thus, the continuous advancement of the blade 5 can be realized, and the conveying-ability of the blade 5 for the components P can be enhanced.

On the rear upper face of the vertical wall portion 2, an alignment feeding device 30 is provided which aligns components P in one row and feeds them onto the blade 5.

Figure 7A:
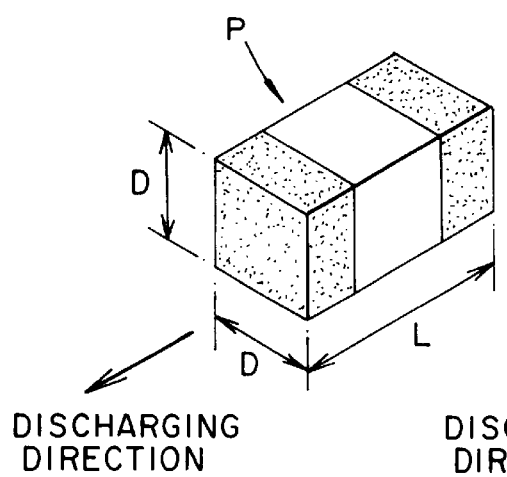
FIGS. 7A and 7B are perspective views of chip components, respectively.
Figure 7B:
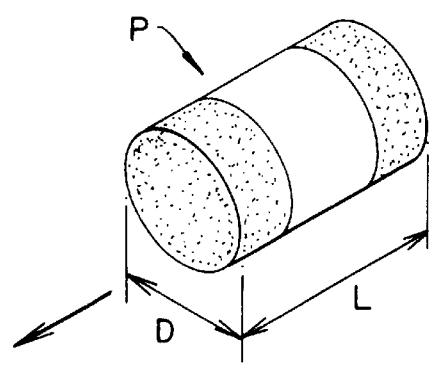

In particular, a stationary drum 31 having a circular concavity 32 is integrally fixed in the backward upper part of the vertical wall portion 2 of the body 1. A rotary drum 33 is rotatably fitted in the circular concavity 32 of the stationary drum 31. A cylindrical component-accommodation chamber 34 is formed between them. A semi-arc shaped chute groove 35 for aligning the components P in the longitudinal direction and sliding them downward is formed on the inner peripheral face of the concavity 32 of the stationary drum 31. The width of the chute groove 35 is larger than the height or width D of a chip component P and is smaller than the length L thereof. The chip component P may have a columnar shape as shown in FIG. 7B, in addition to a rectangular parallelepiped shape as shown in FIG. 7A. At the lower end of the chute groove 35, a gate port 36 is formed which allows the components P sliding down along the chute groove 35 in a predetermined posture (postured so as to lie sideways, directed longitudinally) to pass therethrough one by one. Moreover, a discharging path 37 is provided which aligns the components P passed through the gate port 36 in one row and guides them onto the blade 5. The width and height of the gate port 36 are set to be equal in size to the width of the chute 35, respectively. For this reason, a component P sliding down in the rising-up posture clogs in the gate port 36. On the inner surface of the rotary drum 33, a claw 38 (see FIG. 6) is formed which energizes, oppositely to the discharging direction (in FIG. 2, in the anti-clockwise direction), the component P stopping in the gate port 36 in an abnormal posture to release the clogging. Therefore, even if a component P clogs in the gate port 36, the claw 38 of the rotary drum 33 removes the component P clogging in the gate port 36 or makes the component P lie sideways. Thus, the clogging can be solved.

A conversion mechanism is provided between the feed lever 13 and the rotary drum 33, which converts the swiveling of the feed lever 13 to the anti-clockwise intermittent rotational movement of the rotary drum 33.

In particular, a driven pulley 39 (see FIG. 1) is formed integrally on the outer face of the rotary drum 33. The driven pulley 39 is interlocked with a driving pulley 40 through a belt 41. If a chip component P is clipped between the rotary drum 33 and a peripheral member, caused by the rotation of the rotary drum 33, the belt 41 is slid on the pulley 39 or 40, that is, the belt 41 performs a torque limit function. Thus, breaking of the chip component P can be prevented. As shown in FIG. 4, the driving pulley 40 is rotatably inserted onto the swiveling shaft 12 of the link 11. The feed lever 13 is attached to the outer periphery of the boss of the driving pulley 40 through a first one-way clutch 42. Moreover, the swiveling shaft 12 is interlocked with the inner periphery of the driving pulley 40 through a second one-way clutch 43. In this embodiment, the swiveling shaft 12 is stationary.

When the free end 13a of the feed lever 13 is pushed downward to swivel anti-clockwise as viewed in FIG. 2, the driving pulley 40 is rotated in the anti-clockwise direction as viewed in FIG. 2 integrally with the feed lever 13, due to the first one-way clutch 42. On the other hand, when the feed lever 13 is clockwise swiveled as viewed in FIG. 2 by means of the spring 22, the first one-way clutch 42 idles so that the driving pulley 40 tends to be kept in the stop state. However, since the one-way clutch 42 has a sliding friction, the driving pulley 40 tends to rotate clockwise to some degree, following the feed lever 13. At this time, the second one-way clutch 43 of which the inner ring is fixed to the swiveling shaft 12 blocks the driving pulley 40 from rotating clockwise. As a result, the driving pulley 40 can be securely kept in the stop state. That is, the driving pulley 40 is intermittently rotated only in the anti-clockwise direction.

Figure 1:
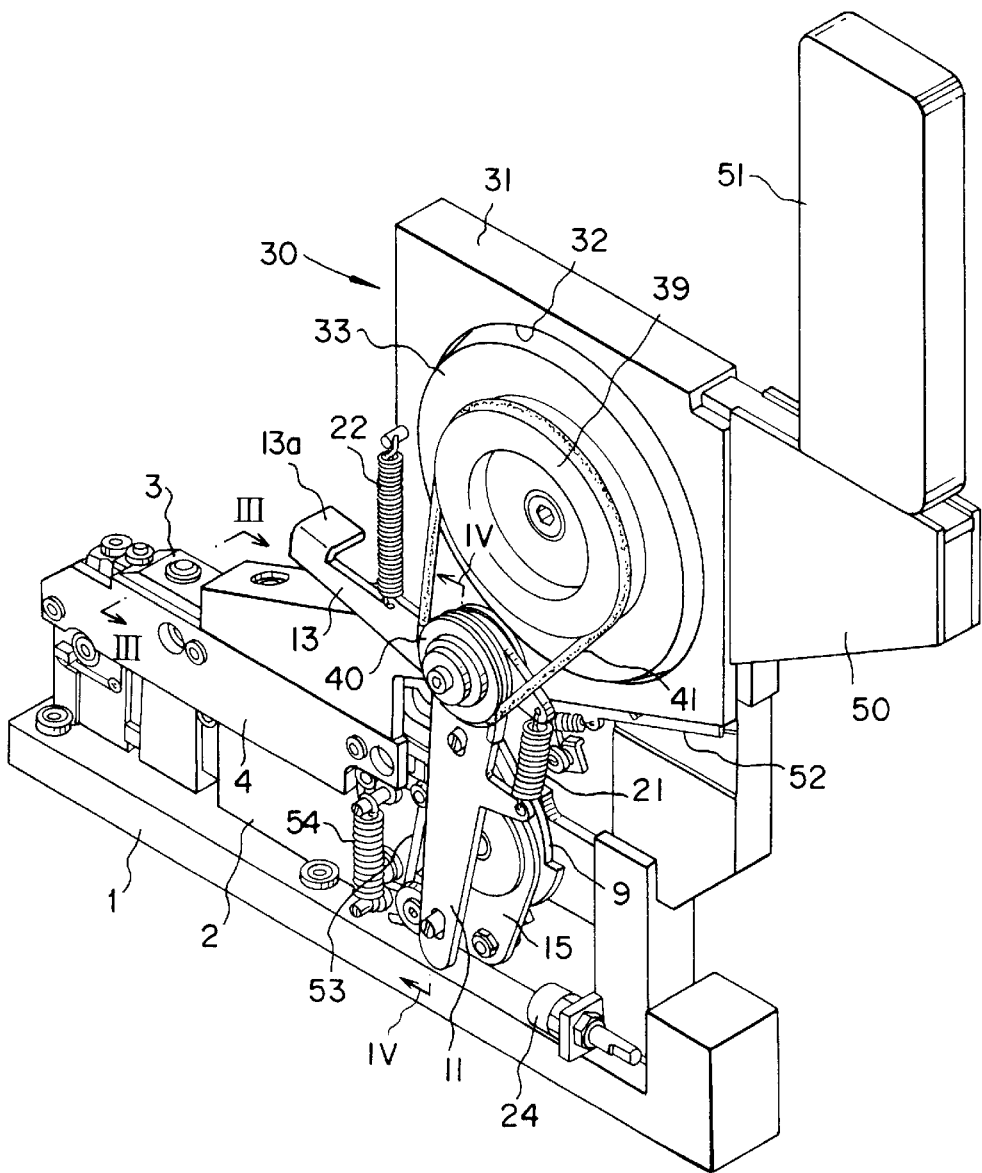
FIG. 1 is a wholly perspective view of a feeding apparatus according to a first embodiment of the present invention.

In FIG. 1, for the purpose of feeding components P into the component accommodation chamber 34, a component charging chamber 50 is provided on the rear, upper side of the stationary drum 31. On the upper side of the component charging chamber 50, a bulk case 51 is provided detachably and in the inverted posture. The component charging chamber 50 and the component-accommodation chamber 34 are in communication with each other through a communication passage (not shown). A component P can be slid from the component charging chamber 50 to fall into the component-accommodation chamber 34 by utilizing the gravitation.

In FIG. 2, the discharging path 37 comprises a straight-line path elongating from the gate port 36 to the blade 5. In FIG. 1, the path comprises two connected straight lines having different slopes. A supporting member 52 reciprocatable in the horizontal direction is provided on the bottom of the path having a relatively small slope, provided on the lower side. In this case, due to the relatively small slope of the path on the lower side, a component can be smoothly transferred onto the blade 5. However, the slidablity of the component is reduced. Accordingly, by moving the supporting member 52 in the vertical direction, the components is prevented from staying. The detail constitution is proposed in Japanese Patent Application No. 10-189549 which the applicant of the present invention was previously filed.

Furthermore, in FIG. 2, for simplified description, the rear end 5c of the blade 5 contacts directly with the peripheral face of the cam 9. In FIG. 1, a cam follower 53 in contact with the cam 9 is additionally provided. The cam follower 53 is interlocked with the rear end of the blade 5. A spring 54 for energizing the cam follower 53 in the cam direction is used instead of the spring 8 for energizing the blade 5 backward. This structure is the same as that proposed in Japanese Patent Application No. 10-185517.

The conveying member for conveying a chip component P discharged from the discharging path 37, to the take-out position of an adsorption nozzle B is not limited to the blade 5. A conveyor belt may be employed. The conveyor belt is intermittently rotated through a ratchet mechanism or the like, by the downward pushing force of the mounter lever A of a chip mounter.

Figures 8, 8A:
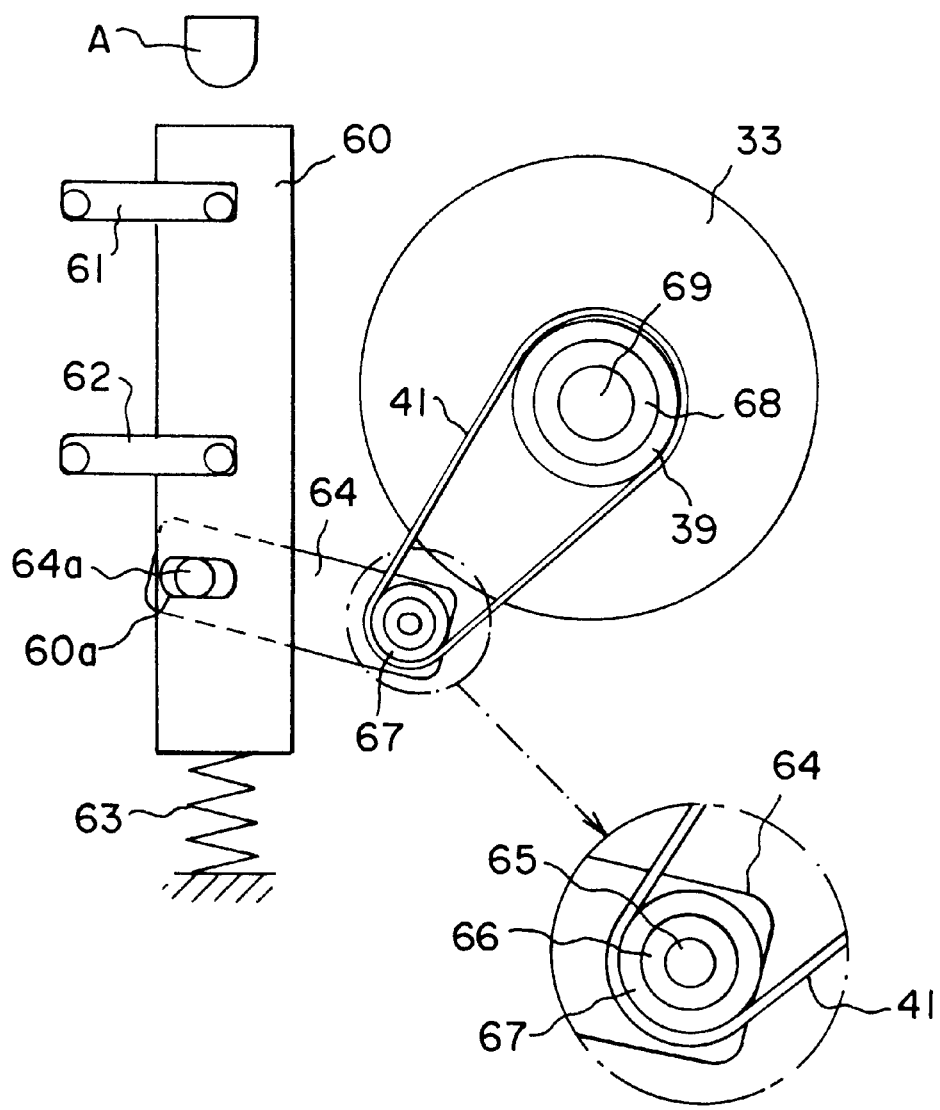
FIG. 8 is a front view of a feeding apparatus according to a second embodiment of the present invention.
Figure 9:
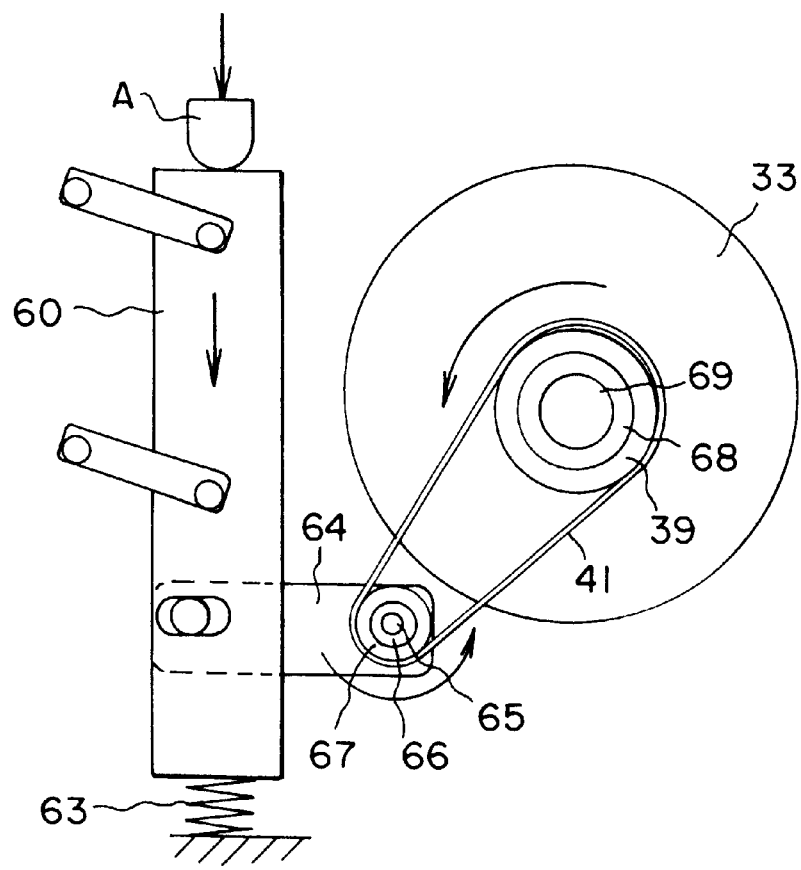
FIG. 9 is a front view of the feeding apparatus of FIG. 8 postured when it is lowered.

FIGS. 8 and 9 show a feeding apparatus according to a second embodiment of the present invention.

In the first embodiment, the feed lever 13 receiving an operational force from the mounter lever A is swiveled on the support shaft 12 as an example. In this embodiment, a first feed lever 60 movable vertically and a swivelable second feed lever 64 are provided.

The first feed lever 60 is supported movably in the vertical direction by a pair of upper and lower links 61 and 62, and is energized upward with a spring 63 at all times. In the lower part of the first feed lever 60, a long hole 60a elongating horizontally is formed. A pin 64a fixed in the top of the second feed lever 64 is slidably engaged with the long hole 60a. A shaft 65 is fixed in the base end of the second feed lever 64. The second feed lever 64 can be swiveled on the shaft 65. A driving pulley 67 is attached on the shaft 65 through A one-way clutch 66. The one-way clutch 66 locks the shaft 65 when the shaft 65 is anti-clockwise rotated, and idles when the shaft 65 is clockwise rotated. A belt 41 is provided between and wound around the driving pulley 67 and a driven pulley 39 disposed on the side-fade of the rotary drum 33. Furthermore, a one-way clutch 68 is provided on the rotary drum 33. The rotary drum 33 is attached to a stationary shaft 69 through the one-way clutch 68. The alignment feeding apparatus 30 similar to that in the first embodiment is provided inside of the rotary drum 33.

In this embodiment, by pushing down the first feed lever 60 by means of the mounter lever A, the second feed lever 64 is anti-clockwise swiveled, as shown in FIG. 9, and the one-way clutch 66 locks so that the driving pulley 67 is anti-clockwise rotated. Therefore, the driven pulley 39 is rotated through the belt 41, following the driving pulley 67, which causes the rotary drum 33 to rotate anti-clockwise.

When the downward pushing force of the mounter lever A is released, the first feed lever 60 is returned upward by means of a spring 63, causing the second feed lever 64 to swivel clockwise. However, the one-way clutch 66 idles for the clockwise rotation. The driving pulley 67 tends to be kept in the stop state. The one-way clutch has a sliding friction, so that the driving pulley 67 tends to rotate clockwise to some degree. At this time, the one-way clutch 68 contained in the rotary drum 33 blocks the driving pulley 67 from rotating clockwise. Thus, the driving pulley 67 can be securely kept in the stop state. Accordingly, the vertical movement of the first feed lever 60 causes the rotary drum 33 to rotate anti-clockwise intermittently.

In this embodiment, the belt 41 also has a torque limit function. Even if a chip component P is clipped between the rotary drum 33 and the gate port 36, and so forth, the belt 41 is slid on the pulley 39 or 67, escaping the force. Therefore, breaking of the chip component P can be prevented.

FIGS. 10 to 13 shows a feeding apparatus according to a third embodiment of the present invention.

This feeding apparatus contains a feed lever 70 and a spring 71 for return-energizing the feed lever 70 upward. The feed lever 70 is supported movably in the vertical direction on an apparatus body 72 (see FIG. 1) through a link 73 and a bell crank 74. The mounter lever A of a chip mounter is disposed on the upper side of the feed lever 70. The mounter lever A, together with the operation of the chip mounter, is moved vertically in a predetermined stroke range. Accordingly, the feed lever 70 is pushed downward by means of the mounter lever A.

An eddy current damper (power transmission means) 75 is provided between the feed lever 70 and a rotary drum 79. The eddy current damper 75 comprises a yoke 76 having a U-shaped cross section, formed integrally with the feed lever 70, a magnet 77 attached to the yoke 76, and a circular ring-shaped, non-magnetic conductor plate 78 movable through the gap of the yoke 76. The conductor plate 78 is fixed to the outer periphery of the rotary drum 79. A magnetic field generated in the yoke 76 acts on the conductor plate 78 in the orthogonal direction. When the yoke 76 and the conductor plate 78 are relatively moved from each other in the vertical direction with respect to the drawing paper of FIG. 11, the magnetic field exerts a resisting force between the yoke 76 and the conductor plate 78. In this embodiment, the yoke 76 is formed on the feed lever 70, and the conductor plate 78 is formed on the rotary drum 79. The yoke 76 may be formed on the rotary drum 79, and the conductor plate 78 may be formed on the feed lever 70.

The rotary drum 79 and the apparatus body 72 form a component accommodation chamber 80 between them, similarly to the first embodiment. The component accommodation chamber 80 is provided with an alignment mechanism containing a chute groove 81, a gate port (not shown), and so forth, with which chip components can be aligned and discharged into the discharging path (not shown) through the gate port. A chip component clogging in the gate port can be removed by a claw 79a formed on the rotary drum 79. A chip component P discharged into the discharging path is fed onto a blade 84 which will be described later.

The rotary drum 79 is rotated with respect to the apparatus body 72. In the event that a chip component P clogs in the sliding portion of the rotary drum 79, an excessive force may be applied to the chip, which causes the chip component P to break. On the other hand, the eddy current damper 75, which is provided in the transmission route from the feed lever 70 to the rotary drum 79, performs a torque limit function for escaping the rotational force of the rotary drum 79. Thus, breaking of the chip component P can be prevented.

Figure 11:
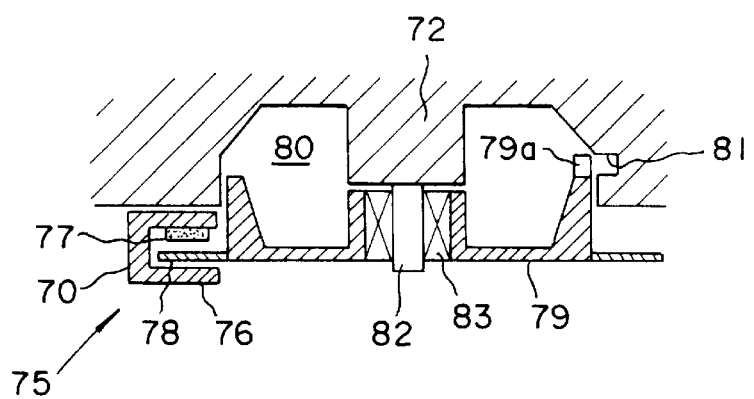
FIG. 11 is a cross sectional view taken along line X—X in FIG. 10.

As shown in FIG. 11, a shaft 82 is fixed to the apparatus body 72. The rotary drum 79 is supported on the shaft 82 through a one-way clutch 83. The one-way clutch 83 permits the rotary drum 79 to rotate only in the anti-clockwise direction. Accordingly, when the mounter lever A is pushed so that the feed lever 70 is lowered, the rotary drum 79 is integrally rotated in the anti-clockwise direction, due to the action of the eddy current damper 75. On the other hand, when the feed lever 70 is elevated, the one-way clutch 83 prevents the rotary drum 79 from rotating. As a result, the rotary drum 79 is intermittently rotated only in the clockwise direction.

Moreover, the eddy current damper 75 not only generates a resisting force for rotating the rotary drum 79, but also exerts, as the reaction force, a resisting force for the feed lever 70. In particular, when the feed lever 70 is moved downward, the rotary drum 79 is integrally rotated. Thus, substantially no resisting force is applied to the feed lever 70. On the other hand, when the feed lever 70 is moved upward, the rotary drum 79 is prevented from rotating clockwise. Thus, a resisting force for preventing the feed lever 70 from moving upward is applied. The force for moving the feed lever 70 upward is caused by the spring 71. Thus, the energizing force of the spring 71 is inhibited by the eddy current damper 75, so that the feed lever 70 is elevated at a low speed.

One arm of the bell crank 74 is interlocked with the lower end of the feed lever 70, while the other arm is interlocked with the blade 84 which is movable horizontally. Therefore, the vertical reciprocation of the feed lever 70 is converted to the horizontal reciprocation of the blade 84. As described above, the feed lever 70 is lowered at a high speed and is elevated at a low speed, due to the action of the eddy current damper 75 and the one-way clutch 83. Accordingly, the blade 84 is moved backward at a high speed, and is moved forward at a low speed. Thus, similarly to the blade 5 in the first embodiment, the blade 84 can securely convey forward a chip component P placed thereon by use of. the frictional resistance.

The operation of the feeding apparatus of the above-described embodiment will be described with reference to FIGS. 10, 12 and 13.

Figure 10:
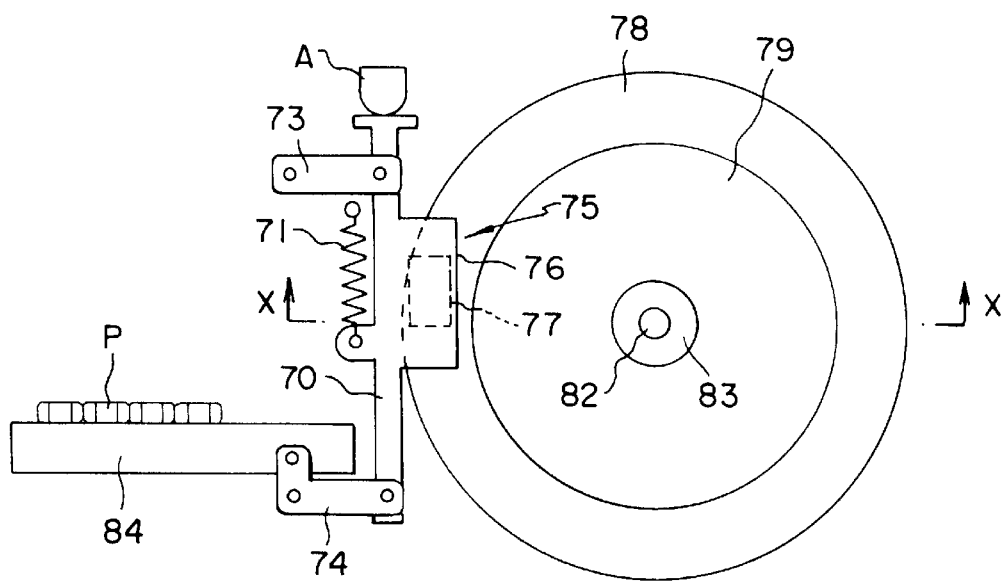
FIG. 10 is a front view of a feeding apparatus according to a third embodiment of the present invention.

FIG. 10 shows the feed apparatus postured when the mounter lever A is in the upper dead point. In this posture, the feed lever 70 is in the uppermost position, and therefore, the blade 84, interlocked with the feed lever 70 through the bell crank 74, is in the most forward position.

FIG. 12 shows the feeding apparatus postured when the mounter lever A starts to be lowered and substantially reaches the lower dead point. Synchronously with the mounter lever A, the feed lever 70 is lowered, which causes the rotary drum 79 to rotate anti-clockwise, due to the action of the eddy current damper 75. In particular, a relative velocity is generated between the yoke 76 having the magnet 77 attached thereto and the conductor plate 78, so that an eddy current is caused, which causes a driving force for anti-clockwise rotating the conductor plate 78 together with the yoke 76. Simultaneously, the feed lever 7 causes the blade 84 to recede at a high speed through the bell crank 74, so that a slid is generated between the chip component P and the blade 84. Thus, only the blade 84 recedes while the chip component P remains unmoved.

The conductor plate 78 is anti-clockwise rotated, which causes the rotary drum 79 to rotate integrally. A claw 79a formed on the rotary drum 79 solves clogging of a chip component P in the gate port, and aligns chip components P in a component accommodation chamber 80 to discharge. If a chip component P clipped between the claw 79a and another part is released from the clipping state by force, the component P may be broken. However, the eddy current damper 75 has such a function that for a torque higher than a predetermined value, the torque is partially escaped. In other words, the damper 75 has such a function as to permit the relative movement between the yoke 76 and the conductor plate 78. Thus, breaking of the chip component P can be prevented.

FIG. 13 shows the feeding apparatus postured when the mounter lever A starts to be elevated from the lower dead point. The feed lever 70 is elevated, due to the elastic energy of the spring 71. When the fed lever 70 is elevated, the blade 84 advances through the bell crank 74. At this time, the elevation speed of the feed lever 70 is inhibited, and the advancement speed of the blade 84 is also inhibited, caused by the action of the eddy current damper 75, since the clockwise rotation of the rotary drum 79 is regulated by the one-way clutch 83. That is, by advancing the blade 84 at a low speed, a chip component P as a whole is moved forward by one pitch, due to the frictional force of the blade 84. When the chip component P is conveyed to the most forward position, the top component is adsorbed by the adsorption nozzle B of the chip mounter to be taken out.

FIGS. 14 to 17 shows a feeding apparatus according to a fourth embodiment of the present invention.

This embodiment is a modified example of the embodiment of FIGS. 10 to 13. Similar or common parts in these embodiments are designated by the same reference numerals, and the repeated description is omitted.

In the embodiment shown in FIGS. 10 to 13, the feed lever 70 movably linearly in the vertical direction is provided with the yoke 76. The magnet 77 is attached to the yoke 76. In the embodiment, the yoke 76 (magnet 77) is moved linearly, and the conductor plate 78 (rotary drum 79) is rotated. The opposed area between the yoke 76 and the conductor plate 78 is varied, depending on the position of the feed lever 70. For this reason, the loss of the driving force generated by the eddy current damper 75 is large. Thus, possibly, the driving force is not effectively be transmitted to the rotational force of the rotary drum 79.

Accordingly, in the fourth embodiment, a substantially sector-shaped swiveling member 90 is rotatably supported on the central shaft 82 of the rotary drum 79. A long hole 91 elongating in the radial direction is formed so as to project from the outer periphery of the swiveling member 90. A pin 93 formed on and protuberant from the side face of the feed lever 70 is engaged with the long hole 92, whereby the vertical movement of the feed lever 70 is converted to the swiveling movement of the swiveling member 90. An eddy current damper (power transmission means) 94 is provided between the swiveling member, 90 and the rotary drum 79. In particular, the eddy current damper 94 comprises an archshaped yoke 95 integrally formed on the outer periphery of the swiveling member 90, plural magnets 96 attached in an arc-shaped arrangement to the inner side face of the yoke 95, and a circular-shaped, non-magnetic conductor plate 78 attached to the outer periphery of the rotary drum 79 and movable through the gap between the magnets 96 and the yoke 95 opposed to the magnets 96. The yoke 95 may be provided only in a part of the outer periphery of the swiveling member 90. The whole of the swiveling member 90 may be formed from a magnetic material. Furthermore, between the rotary drum 79 and the center axis 82, a one-way clutch 83 which permits the rotation only in the arrow direction (in FIG. 14, in the anti-clockwise direction) of the rotary drum 79 is provided.

The operation of the feeding apparatus of the fourth embodiment will be described with reference to FIGS. 14, 16, and 17.

FIG. 14 shows the feeding apparatus postured when the mounter lever A is in the upper dead point. Furthermore, the feed lever 70 is in the uppermost position. Since the feed lever 70 is in the uppermost position, the blade 84 interlocked with the feed lever 70 through the bell crank 74 is in the most forward position.

FIG. 16 shows the feeding apparatus postured when the mounter lever A starts to be lowered and reaches substantially the lower dead point. Synchronously with the mounter lever A, the feed lever is also lowered, and the pin 93 formed on and projecting from the side face of the feed lever 70 causes the swiveling member 90 to swivel anticlockwise as viewed in FIG. 16. With the action of the eddy current damper 94, the rotary drum 79 is anti-clockwise rotated, following the swiveling member 90. In particular, a relative velocity is produced between the yoke having the magnets attached thereto and the conductor plate 78, causing an eddy current in the conductor plate 78 to generate a driving force for anti-clockwise rotating the conductor plate 78 together with the yoke 95 and simultaneously move backward the blade 84 through the bell crank 74 at a high speed, resulting a slide between the blade 84 and the chip component P. As a result, only the blade 84 recedes with the chip component P remaining unmoved.

When the rotary drum 79 is anti-clockwise rotated, the claw 79a provided on the rotary drum 79 solves clogging of a chip component P in the gate port. At this time, an excessive load may be applied to the chip component P. The eddy current damper 94 has a function of escaping a torque (a torque limit function). Even if when a torque higher than a predetermined value is applied thereto, breaking of the chip component P can be prevented.

FIG. 17 shows the feeding apparatus postured when the mounter lever A starts to be elevated from the lower dead point. The feed lever 70 is elevated, due to the elastic energy of the spring 71. When the feed lever 71 is elevated, the swiveling member 90 is clockwise swiveled, and the blade 84 advances through the bell crank 74. At this time, the rotary drum 79 to which a torque is transmitted from the swiveling member 90 through the eddy current damper 94 tends to rotate clockwise. However, the clockwise rotation of the rotary drum 79 is regulated by the one-way clutch 83. For this reason, with the action of the eddy current damper 94, the clockwise swiveling of the swiveling member 90 is braked, so that the elevation speed of the feed lever 70 is inhibited, and moreover, the advancement speed of the blade 84 is inhibited. That is, by moving forward the blade 84 at a low speed, a chip component P, as a whole, can be securely moved forward by one pitch, attributed by the frictional force of the blade 84.

In this embodiment, the swiveling member 90 and the rotary drum 79 are coaxially attached, so that the operational direction of the yoke 95 and the conductor plate 78 are completely coincident. Therefore, the area of the conductor plate through which a magnetic flux generated in the magnet 96 is passed is not changed, so that the driving force generated by the eddy current damper can be used for rotation of the rotary drum most effectively. Accordingly, when the feed lever 70 is operated at a high speed, a stable torque can be produced to the rotary drum 79. Furthermore, the low speed advancement and the high speed recession of the blade 84 can be controlled with high stability.

FIG. 18 shows a feeding apparatus according to a fifth embodiment of the present invention. This embodiment is a modified example of the embodiment shown in FIGS. 14 to 17.

In the fourth embodiment, an input load of the mounter lever A is transmitted to the swiveling member 90 through the feed lever 70. In the fifth embodiment, by integrating the feed lever with the swiveling member, the swiveling member 90 can be directly swiveled by means of the mounter lever A. For this purpose, a contact portion 97 to contact with the mounter lever A is provided in the outer periphery of the swiveling member 90. Moreover, in the swiveling member 90, a protuberant portion 98 having a long hole elongating in the radial direction is provided. A pin 74a provided on one end of bell crank 74 is engaged with the long hole 98a.

In this case, the number of parts can be reduced, and the apparatus can be reduced in size.

FIGS. 19 to 22 shows a feeding apparatus according to a sixth embodiment of the present invention.

In this embodiment, the feeding apparatus comprises the feed lever 70, the rotary drum 79, the one-way clutch 83, an eddy-current damper 100, and so forth. The configurations of the feed lever 70, the spring 71, the bell crank 74, the blade 84, the rotary drum 79, the one-way clutch 83, and so forth are the same as those of the embodiment shown in FIGS. 10 to 13. Similar parts in the embodiments are designated by the same reference numerals, and the repeated description is omitted.

The eddy current damper 100 comprises a circular yoke 101 having magnets 102 attached to the inner face thereof and a disk-shaped non-magnetic conductor plate 103 arranged in the gap of the yoke 101. The plural magnets 102 are attached, arranged in the circumferential direction. The yoke 101 is attached to the rotary shaft 104 through a one-way clutch 105, and can be rotated only in the clockwise direction as viewed in FIG. 19. The conductor plate 103 is attached coaxially with the yoke 101, and can be rotated both in the clockwise and anti-clockwise directions.

An elastic belt 106 is provided on the circumference of the yoke 101, and is in contact with the outer peripheral face of the rotary drum 79. In this embodiment, the circular belt 106 having a circular cross section is used. The shape may be optional, e.g., a rectangular cross-section may be used. With the frictional force of the elastic belt 106, the rotation of the yoke 101 is transmitted to the rotary drum 79, causing the rotary drum 79 to rotate.

The conductor plate 103 is connected to a link 108 through a pin 107. The link 108 is interlocked with the feed lever 70 through a bell crank 109. Accordingly, the vertical movement of the feed lever 70 is converted to the swiveling rotation movement of the conductor plate 103 on a shaft 104.

Next, the operation of the feeding apparatus of the above embodiment will be described with reference to FIGS. 19, 21, and 22.

FIG. 19 shows the feeding apparatus postured when the mounter lever A is in the upper dead point. Also, the feed lever 70 is in the uppermost position. Since the feed lever 70 is in the uppermost position, the blade 84 connected to the feed lever 70 through the bell crank is in the most forward position.

FIG. 21 shows the feeding apparatus postured when the mounter lever A starts to be lowered and substantially reaches the lower dead point. Synchronously with the mounter lever A, the feed lever 70 is lowered. The conductor plate 103 connected to the feed lever 70 through the bell crank 109 and the link 108 is swiveled and rotated in the clockwise direction. At this time, with the action of the eddy current damper 100, the yoke conveyor body 11 is clockwise rotated following the conductor plate 103. In particular, a relative velocity is produced between the yoke 101 having the magnet 102 attached thereto, so that an eddy current is generated in the conductor plate 103 to produce a driving force for clockwise rotating the yoke 101 together with the conductor plate 103. Simultaneously, the blade 84 is moved backward at a high speed through the bell crank 74, so that a slid is produced between the blade 84 and the chip component P. Only the blade 84 is moved backward with the chip component P remaining unchanged in position.

When the yoke 101 is clockwise rotated, the rotary drum 79 is anti-clockwise rotated following the yoke, due to the frictional force of the elastic belt 106. As a result, the claw 79a release clogging of a chip component P in the gate port if it happens. At this time, an excessive load may be applied to the chip component P. However, since the eddy current damper 100 has a torque limit function, breaking of the chip component P can be prevented.

FIG. 22 shows the feeding apparatus postured when the mounter lever A starts to be elevated from the lower dead point. The feed lever 70 is elevated, due to the elastic energy of the spring 71. When the feed lever 70 is elevated, the conductor plate 103 connected to the feed lever 71 through the bell crank 109 and the link 108 is swiveled and rotated anti-clockwise as viewed in FIG. 22. Accordingly, with the operation of the eddy current damper 100, the yoke 101 is about to rotate anti-clockwise. However, the anti-clockwise rotation is blocked by the one-way clutch 105. Accordingly, the rotary drum 79 is not rotated.

Since the anti-clockwise rotation of the yoke 101 is blocked by the one-way clutch 105, the anti-clockwise rotation of the conductor plate 103 is braked through the eddy current damper 100. With the feed lever 70 being elevated, the blade 84 advances through the bell crank 74. However, the elevation speed of the feed lever 70 is inhibited, due to the rotation resistance of the conductor plate 103, and the advancement speed of the blade 84 is also inhibited. That is, by moving forward the blade 84 at a low speed, the whole of a chip component P is moved forward by one pitch, due to the frictional force of the blade 84.

In this embodiment, the yoke 101 and the conductor plate 103 constituting the eddy current damper 100 are coaxially provided. Accordingly, the area through which a magnetic flux is passed is not changed, and the eddy current damper 100 can emit a stable driving force. Both of the yoke 101 and the conductor plate 100 are formed in a circular shape, and the radii of gyration are small, so that effects of inertial is considerably reduced. Thus, hazardous influences such as vibration at high speed operation and so forth can be inhibited. Furthermore, the yoke 101 and the conductor plate 103 are rotatably provided on the shaft 104 which is separated from the rotary drum 79. Thus, the yoke and the conductor plate 103 can be optionally positioned. The flexibility of layout is enhanced. The height of the feeding apparatus can be realized.

FIG. 23 shows a feeding apparatus according to a seventh embodiment of the present invention. The embodiment is a modified example of the embodiment of FIGS. 19 to 22.

In the sixth embodiment, the elastic belt 106 is disposed on the outer periphery of the yoke 101. With the frictional force of the belt 106, the rotary drum 79 can be rotated following the yoke 101. In the seventh embodiment, gears 101a and 79a are provided on the outer periphery of the yoke 101 and that of the rotary drum 79, respectively, which are engaged with each other.

In this case, the gears 101a and 79a, interlocked with each other, can be securely rotated.

The present invention is not limited to the above-described embodiments.

In the above-described embodiments, the blade is used as a means for conveying a chip component P discharged from the discharge path to the take-out position. An endless conveyor belt may be employed. In this case, a driving pulley for driving the belt may be intermittently rotated by means of a ratchet mechanism, using a feed lever, and so forth.

Furthermore, for the purpose of releasing a chip component clogging in the gate port, the claw of the rotary drum is used as a rotational member. A rotary vane may be used as described in Japanese Unexamined Patent Application Publication no. 11-71018. In this case, the rotary drum doesn't need to be used.

As the conversion mechanism, the frictional belt is used in the first and second embodiments. In the third to seventh embodiments, the eddy current damper is employed. The frictional belt and the eddy current damper are not restrictive. A means, which transmits a power and has a torque limit function, is available.

As seen in the above description, the feeding apparatus of the present invention comprises the feed lever which is reciprocated correspondingly to a load input from the chip mounter, and the conversion mechanism for converting the reciprocation of the feed lever to the rotational movement of the rotary member. Accordingly, a driving source for rotating the rotary member is unnecessary. The structure can be simplified. Furthermore, the adsorption and taking-out of a chip component synchronous with the rotation of the rotary drum can be realized.

Furthermore, the conversion mechanism has a torque limit function by which a slide is generated when the rotation resistance of the rotary member becomes higher than a predetermined value. Even if a chip component clogging in the gate port is caught in the rotary member, the rotational force of the rotary member is escaped, preventing an excessive load from being applied to the chip component. Thus, advantageously, breaking of the chip component can be prevented.

What is claimed is:

1. A feeding apparatus for a chip component having a component accommodation chamber for accommodating many chip components, an alignment path for aligning the chip components in the component accommodation chamber in one row to discharge, and a rotary member for solving clogging of a chip component in the alignment path, comprising a feed lever operable to be reciprocated linearly or swiveled correspondingly to a load input from a chip mounter, and a conversion mechanism for converting the motion of the feed lever to the rotational movement of the rotary member and having a torque limit function of preventing the rotational force of the rotary member when the rotational resistance of the rotary member becomes higher than a predetermined value.

2. A feeding apparatus for a chip component according to claim 1, wherein the alignment path comprises a chute groove formed in the inner periphery of the component accommodation chamber and suited to align chip components in a predetermined direction and slide the chip components downward, a gate port formed in the lower end of the chute groove and permitting chip components sliding down in a predetermined posture along the chute groove to pass therethrough one by one, and a discharging path for aligning the chip components passed through the gate port in one row to discharge.

3. A feeding apparatus for a chip component according to claim 2, wherein the rotary member is a claw portion provided on the inner wall of a rotary drum constituting one side wall of the component accommodation chamber, operable to be rotated along the inner periphery of the component accommodation chamber, and suited to energize a chip component stopping in the gate port in an abnormal posture oppositely to the discharging direction to release the clogging.

4. A feeding apparatus for a chip component according to claim 2, wherein the conversion mechanism comprises a shaft for swivelably supporting the feed lever, a driving pulley attached to the shaft, a driven pulley attached to the rotary member, a one-way clutch provided between the shaft for the feed lever and the driving pulley or between the rotary member and the driven pulley, and a belt provided between and wound around the driving pulley and the driven pulley, whereby the belt is slid when a torque higher than a predetermined value is applied to the driving pulley or the driven pulley.

5. A feeding apparatus for a chip component according to claim 2, wherein the conversion mechanism comprises a power transmission means provided between the feed lever and the rotary member and utilizing an eddy current damper, and a one-way clutch allowing the rotary member to rotate only in one direction.

6. A feeding apparatus for a chip component according to claim 2, wherein the conversion mechanism comprises a swiveling member interlocked with the feed lever and provided coaxially with the rotary member, a power transmission means provided between the swiveling member and the rotary member and utilizing an eddy current damper, and a one-way clutch allowing the rotary member to rotate only in one direction.

7. A feeding apparatus for a chip component according to claim 2, wherein the conversion mechanism comprises a first swiveling member interconnected with the feed lever and operable to be swiveled by operation of the feed lever, a second swiveling member provided coaxially with the first swiveling member and operable to be swiveled correspondingly to the movement of the first swiveling member and transmit a power to the rotary member, a power transmission means provided between the first and second swiveling members and utilizing an eddy current damper, and a one-way clutch allowing the rotary member to rotate only in one direction.

8. A feeding apparatus for a chip component according to claim 1, wherein the rotary member is a claw portion provided on the inner wall of a rotary drum constituting one side wall of the component accommodation chamber, operable to be rotated along the inner periphery of the component accommodation chamber, and suited to energize a chip component stopping in the gate port in an abnormal posture oppositely to the discharging direction to release the clogging.

9. A feeding apparatus for a chip component according to claim 8, wherein the conversion mechanism comprises
   a shaft for swivelably supporting the feed lever,
   a driving pulley attached to the shaft,
   a driven pulley attached to the rotary member,
   a one-way clutch provided between the shaft for the feed lever and the driving pulley or between the rotary member and the driven pulley, and
   a belt provided between and wound around the driving pulley and the driven pulley,
   whereby the belt is slid when a torque higher than a predetermined value is applied to che driving pulley or the driven pulley.

10. A feeding apparatus for a chip component according to claim 8, wherein the conversion mechanism comprises
    a power transmission means provided between the feed lever and the rotary member and utilizing an eddy current damper, and
    a one-way clutch allowing the rotary member to rotate only in one direction.

11. A feeding apparatus for a chip component according to claim 8, wherein the conversion mechanism comprises
    a swiveling member interlocked with the feed lever and provided coaxially with the rotary member,
    a power transmission means provided between the swiveling member and the rotary member and utilizing an eddy current damper, and
    a one-way clutch allowing the rotary member to rotate only in one direction.

12. A feeding apparatus for a chip component according to claim 8, wherein the conversion mechanism comprises
    a first swiveling member interconnected with the feed lever and operable to be swiveled by operation of the feed lever,
    a second swiveling member provided coaxially with the first swiveling member and operable to be swiveled correspondingly to the movement of the first swiveling member and transmit a power to the rotary member,
    a power transmission means provided between the first and second swiveling members and utilizing an eddy current damper, and
    a one-way clutch allowing the rotary member to rotate only in one direction.

13. A feeding apparatus for a chip component according to claim 1, wherein the conversion mechanism comprises
    a shaft for swivelably supporting the feed lever,
    a driving pulley attached to the shaft,
    a driven pulley attached to the rotary member,
    a one-way clutch provided between the shaft for the feed lever and the driving pulley or between the rotary member and the driven pulley, and
    a belt provided between and wound around the driving pulley and the driven pulley,
    whereby the belt is slid when a torque higher than a predetermined value is applied to the driving pulley or the driven pulley.

14. A feeding apparatus for a chip component according to claim 1, wherein the conversion mechanism comprises
    a power transmission means provided between the feed lever and the rotary member and utilizing an eddy current damper, and
    a one-way clutch allowing the rotary member to rotate only in one direction.

15. A feeding apparatus for a chip component according to claim 5, wherein the power transmission means utilizing the eddy current damper comprises
    a non-magnetic conductor provided on one of the member,
    a yoke provided on the other of the member and constituting a magnetic path, and
    a magnet attached to the yoke in such a manner that a flux acts on the non-magnetic conductor orthogonally.

16. A feeding apparatus for a chip component according to claim 1, wherein the conversion mechanism comprises
    a swiveling member interlocked with the feed lever and provided coaxially with the rotary member,
    a power transmission means provided between the swiveling member and the rotary member and utilizing an eddy current damper, and
    a one-way clutch allowing the rotary member to rotate only in one direction.

17. A feeding apparatus for a chip component according to claim 16, wherein the power transmission means utilizing the eddy current damper comprises
    a non-magnetic conductor provided on one of the member,
    a yoke provided on the other of the member and constituting a magnetic path, and
    a magnet attached to the yoke in such a manner that a flux acts on the non-magnetic conductor orthogonally.

18. A feeding apparatus for a chip component according to claim 1, wherein the conversion mechanism comprises
    a first swiveling member interconnected with the feed lever and operable to be swiveled by operation of the feed lever,
    a second swiveling member provided coaxially with the first swiveling member and operable to be swiveled correspondingly to the movement of the first swiveling member and transmit a power to the rotary member,
    a power transmission means provided between the first and second swiveling members and utilizing an eddy current damper, and
    a one-way clutch allowing the rotary member to rotate only in one direction.

19. A feeding apparatus for a chip component according to claim 18, wherein the power transmission means utilizing the eddy current damper comprises
    a non-magnetic conductor provided on one of the member,
    a yoke provided on the other of the member and constituting a magnetic path, and
    a magnet attached to the yoke in such a manner that a flux acts on the non-magnetic conductor orthogonally.

* * * * *